(12) United States Patent
Abe et al.

(10) Patent No.: US 10,513,118 B2
(45) Date of Patent: Dec. 24, 2019

(54) METHODS OF PRODUCING ELECTROMECHANICAL TRANSDUCER, SENSOR, AND ACTUATOR

(71) Applicant: RICOH COMPANY, LTD., Tokyo (JP)

(72) Inventors: Shuya Abe, Kanagawa (JP); Osamu Machida, Kanagawa (JP); Masahiro Ishimori, Tokyo (JP); Takuma Hirabayashi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 16 days.

(21) Appl. No.: 15/491,354

(22) Filed: Apr. 19, 2017

(65) Prior Publication Data

US 2017/0306471 A1    Oct. 26, 2017

(30) Foreign Application Priority Data

Apr. 22, 2016    (JP) .................................. 2016-086517

(51) Int. Cl.
*B41J 2/14* (2006.01)
*B41J 2/16* (2006.01)
*C23C 14/16* (2006.01)

(52) U.S. Cl.
CPC ............. *B41J 2/162* (2013.01); *B41J 2/1433* (2013.01); *B41J 2/1646* (2013.01);
(Continued)

(58) Field of Classification Search
CPC . B41J 2/1433; B41J 2/161; B41J 2/162; B41J 2/1628; B41J 2/1629; B41J 2/1631;
(Continued)

(56) References Cited

U.S. PATENT DOCUMENTS

| 4,740,800 A | * | 4/1988 | Kyoshima | .............. B41J 2/1629 216/27 |
| 5,600,197 A | * | 2/1997 | Takeuchi | ............... B41J 2/1646 310/324 |

(Continued)

FOREIGN PATENT DOCUMENTS

| JP | 2009253027 A | * | 10/2009 |
| JP | 2012-121262 |   | 6/2012 |

(Continued)

*Primary Examiner* — A. Dexter Tugbang
(74) *Attorney, Agent, or Firm* — Oblon, McClelland, Maier & Neustadt, L.L.P.

(57) ABSTRACT

There is provided a method of producing an electromechanical transducer that includes a plurality of electromechanical transducer elements on a substrate. The method includes forming a plurality of individual electrodes corresponding to the plurality of electromechanical transducer elements on the substrate, forming an insulation film to cover the plurality of individual electrodes on the substrate, forming a conductive film on the insulation film, forming a plurality of openings to expose the plurality of individual electrodes in each of the insulation film and the conductive film, and forming a plurality of electromechanical transducer films on the plurality of individual electrodes exposed in the plurality of openings.

9 Claims, 17 Drawing Sheets

(52) U.S. Cl.
CPC .............. *C23C 14/165* (2013.01); *Y10T 29/42* (2015.01); *Y10T 29/49401* (2015.01)

(58) Field of Classification Search
CPC ...... B41J 2/1642; B41J 2/1645; B41J 2/1646; C23C 14/165; Y10T 29/42; Y10T 29/49401; H01L 41/187; H01L 41/314; H01L 41/317
See application file for complete search history.

(56) References Cited

U.S. PATENT DOCUMENTS

| | | | | |
|---|---|---|---|---|
| 5,793,149 | A * | 8/1998 | Thiel | B41J 2/161 310/324 |
| 6,158,847 | A * | 12/2000 | Usui | B41J 2/1646 347/70 |
| 2007/0130740 | A1* | 6/2007 | Mita | B41J 2/1646 29/25.35 |
| 2010/0212129 | A1* | 8/2010 | Hara | B41J 2/1646 29/25.35 |
| 2011/0175967 | A1 | 7/2011 | Machida et al. | |
| 2012/0026249 | A1 | 2/2012 | Kihira et al. | |
| 2012/0206544 | A1 | 8/2012 | Machida et al. | |
| 2012/0236084 | A1 | 9/2012 | Watanabe et al. | |
| 2012/0314007 | A1 | 12/2012 | Shimofuku et al. | |
| 2013/0050346 | A1 | 2/2013 | Takeuchi et al. | |
| 2013/0070028 | A1 | 3/2013 | Watanabe et al. | |
| 2013/0070029 | A1 | 3/2013 | Mizukami et al. | |
| 2013/0162726 | A1 | 6/2013 | Mizukami et al. | |
| 2013/0176364 | A1 | 7/2013 | Machida et al. | |
| 2013/0194350 | A1 | 8/2013 | Watanabe et al. | |
| 2013/0250007 | A1 | 9/2013 | Ishimori et al. | |
| 2013/0250009 | A1 | 9/2013 | Ishimori et al. | |
| 2014/0049582 | A1 | 2/2014 | Machida et al. | |
| 2014/0210913 | A1 | 7/2014 | Shimofuku et al. | |
| 2014/0267509 | A1 | 9/2014 | Shinkai et al. | |
| 2014/0340854 | A1 | 11/2014 | Akiyama et al. | |
| 2014/0375728 | A1 | 12/2014 | Machida et al. | |
| 2015/0022592 | A1 | 1/2015 | Aoyama et al. | |
| 2015/0070444 | A1 | 3/2015 | Ishimori et al. | |
| 2015/0145924 | A1 | 5/2015 | Shimofuku et al. | |
| 2016/0049579 | A1 | 2/2016 | Shimofuku et al. | |
| 2016/0099402 | A1 | 4/2016 | Mizukami et al. | |
| 2016/0221033 | A1 | 8/2016 | Akiyama et al. | |

FOREIGN PATENT DOCUMENTS

| | | |
|---|---|---|
| JP | 2013-065670 | 4/2013 |
| JP | 2014-024275 | 2/2014 |
| JP | 2016-042566 | 3/2016 |

* cited by examiner

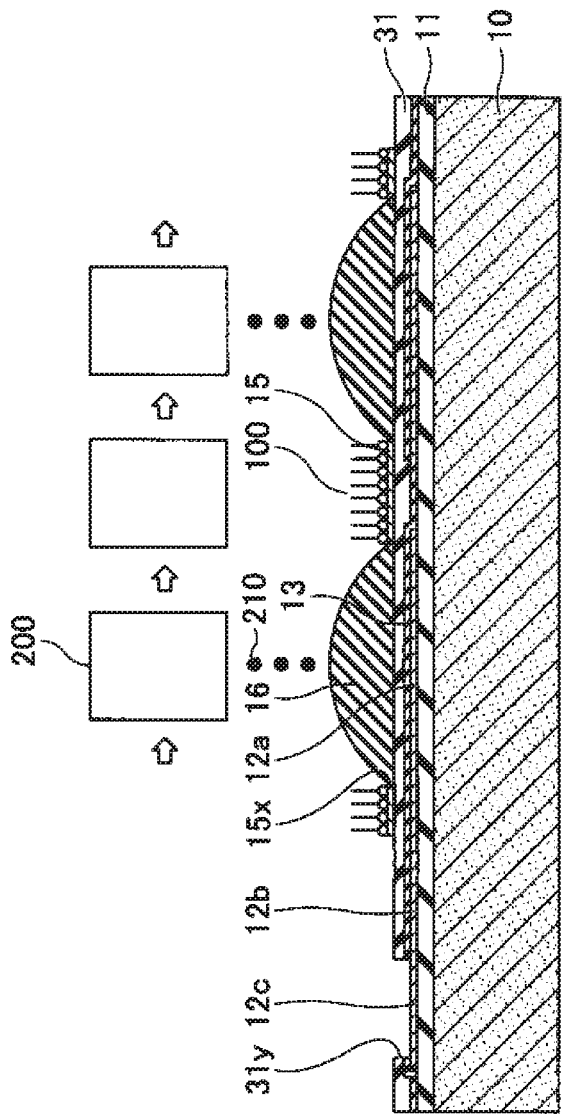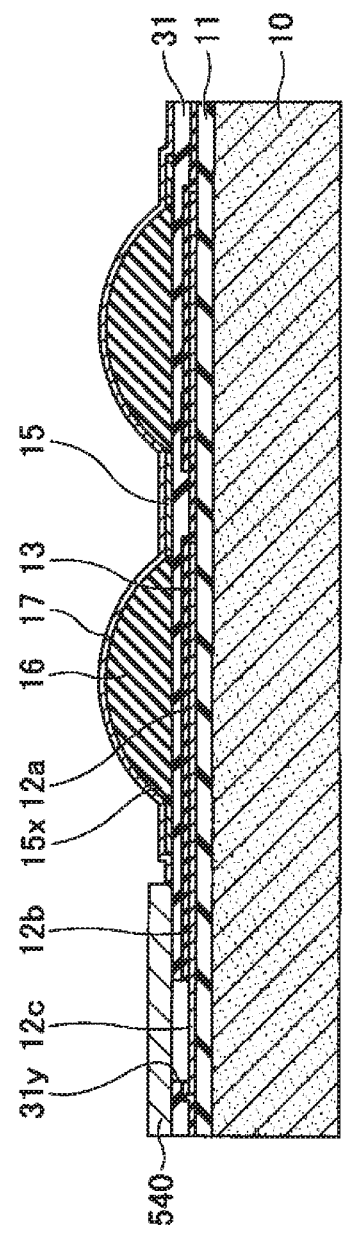

METHODS OF PRODUCING ELECTROMECHANICAL TRANSDUCER, SENSOR, AND ACTUATOR

CROSS-REFERENCE TO RELATED APPLICATIONS

This patent application is based on and claims priority pursuant to 35 U.S.C. § 119(a) to Japanese Patent Application No. 2016-086517, filed on Apr. 22, 2016 in the Japan Patent Office, the entire disclosure of which is hereby incorporated by reference herein.

BACKGROUND

Technical Field

Aspects of the present disclosure relate to an electromechanical transducer, a sensor, an actuator, and methods of producing the electromechanical transducer, the sensor, and the actuator, a liquid discharge head, a liquid discharge device, and a liquid discharge apparatus.

Related Art

An electromechanical transducer is known that includes a substrate and a plurality of electromechanical transducer elements disposed on the substrate. Each of the electromechanical transducer elements includes an electromechanical transducer film that is a ferroelectric film used as, for example, piezoelectric actuator.

As one of a method of forming such an electromechanical transducer film, for example, a chemical solution deposition (CSD) method (also referred to as a sol-gel method) is known. For the CSD method, for example, a process of forming a coating film of a precursor solution of an electromechanical transducer film on a lower electrode and crystallizing the coating film by heating is repeated a predetermined number of times to form the electromechanical transducer film.

SUMMARY

In an aspect of the present disclosure, there is provided a method of producing an electromechanical transducer that includes a plurality of electromechanical transducer elements on a substrate. The method includes forming a plurality of individual electrodes corresponding to the plurality of electromechanical transducer elements on the substrate, forming an insulation film to cover the plurality of individual electrodes on the substrate, forming a conductive film on the insulation film, forming a plurality of openings to expose the plurality of individual electrodes in each of the insulation film and the conductive film, and forming a plurality of electromechanical transducer films on the plurality of individual electrodes exposed in the plurality of openings.

In another aspect of the present disclosure, there is provided a method of producing a sensor that includes the above-described method of producing an electromechanical transducer.

In still another aspect of the present disclosure, there is provided a method of producing an actuator that includes the above-described method of producing an electromechanical transducer.

In still yet another aspect of the present disclosure, there is provided a method of producing an electromechanical transducer that includes a plurality of electromechanical transducer elements on a substrate. The method includes forming a plurality of individual electrodes corresponding to the plurality of electromechanical transducer elements on the substrate, forming a common electromechanical transducer film to serially cover the plurality of individual electrodes on the substrate, forming a conductive film on the common electromechanical transducer film, forming a plurality of openings in the conductive film to expose the common electromechanical transducer film on the plurality of individual electrodes, and forming a plurality of electromechanical transducer films on the common electromechanical transducer film exposed in the plurality of openings.

In still yet another aspect of the present disclosure, there is provided an electromechanical transducer that includes a substrate, a plurality of electromechanical transducer elements, a plurality of individual electrodes, a cover film, a conductive film, a plurality of openings, and a plurality of electromechanical transducer films. The plurality of electromechanical transducer elements is disposed on the substrate. The plurality of individual electrodes corresponds to the plurality of electromechanical transducer elements. The plurality of individual electrodes is disposed on the substrate. The cover film is disposed on the substrate to cover the plurality of individual electrodes. The conductive film is disposed on the cover film. The plurality of openings is formed in at least the conductive film to expose the plurality of individual electrodes or the cover film. The plurality of electromechanical transducer films is disposed on the plurality of individual electrodes or the cover film exposed in the plurality of openings.

In still yet another aspect of the present disclosure, there is provided a liquid discharge head that includes a plurality of electromechanical transducers and a nozzle plate. Each of the plurality of electromechanical transducers is the above-described electromechanical transducer. The nozzle plate is bonded to the substrate of the electromechanical transducer. The substrate includes a plurality of liquid chambers penetrating the substrate, the plurality of electromechanical transducers partially exposed through the plurality of liquid chambers. The nozzle plate is bonded to a first side of the plurality of liquid chambers opposite a second side of the plurality of liquid chambers at which the plurality of electromechanical transducer films is disposed. The nozzle plate includes a plurality of nozzles corresponding to the plurality of liquid chambers.

In still yet another aspect of the present disclosure, there is provided a liquid discharge device that includes the liquid discharge head to discharge liquid.

In still yet another aspect of the present disclosure, there is provided a liquid discharge apparatus that includes the liquid discharge head to discharge liquid.

In still yet another aspect of the present disclosure, there is provided a sensor that includes the electromechanical transducer.

In still yet another aspect of the present disclosure, there is provided an actuator that includes the electromechanical transducer.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein:

FIGS. 14A and 14B are illustrations of the production process of the electromechanical transducer according to the third embodiment;

Figure 1A:
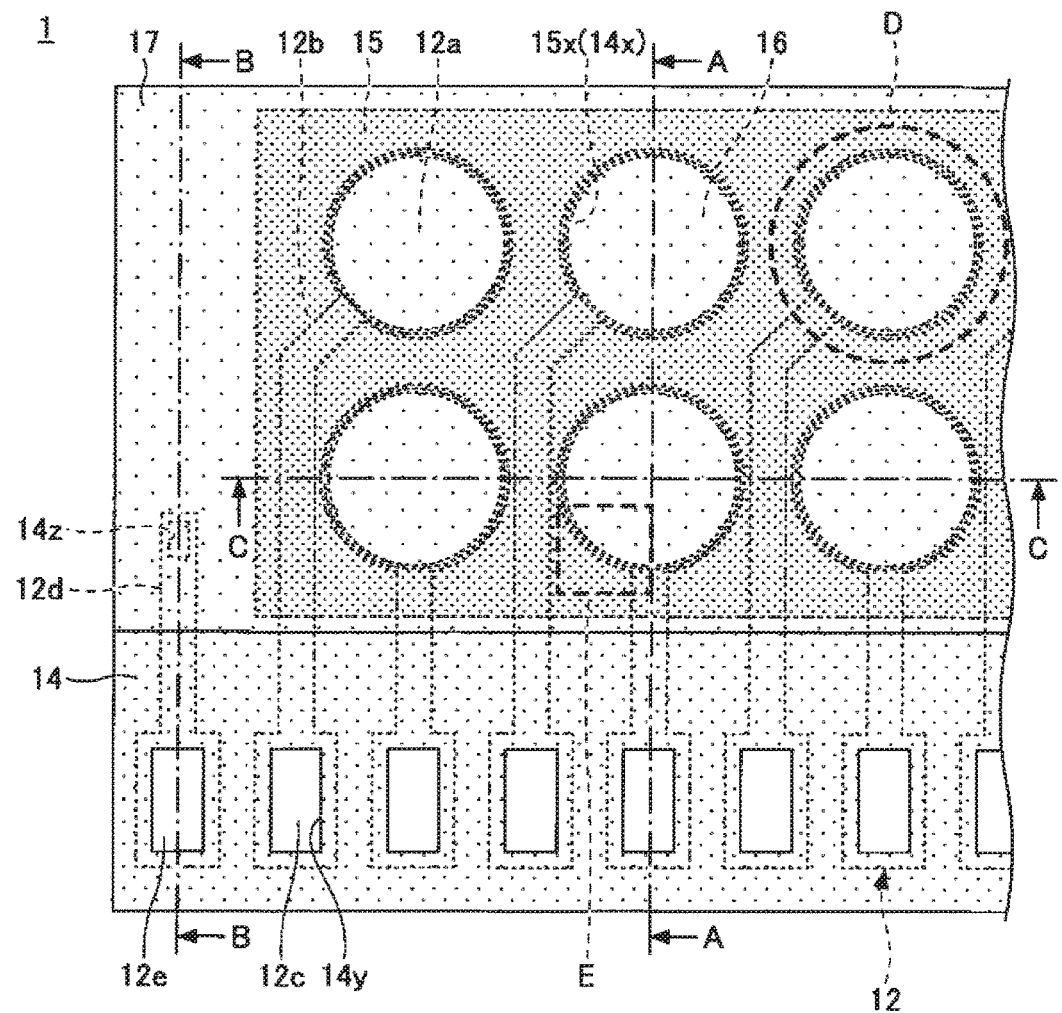
FIG. 1A is a plan view of an electromechanical transducer according to a first embodiment of the present disclosure.

The accompanying drawings are intended to depict embodiments of the present disclosure and should not be interpreted to limit the scope thereof The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Below, embodiments of the present disclosure are described with reference to accompanying drawings. In each of the drawings, the same reference codes are allocated to components or portions having the same configuration and redundant descriptions of the same components may be omitted.

First Embodiment

Figure 1B:
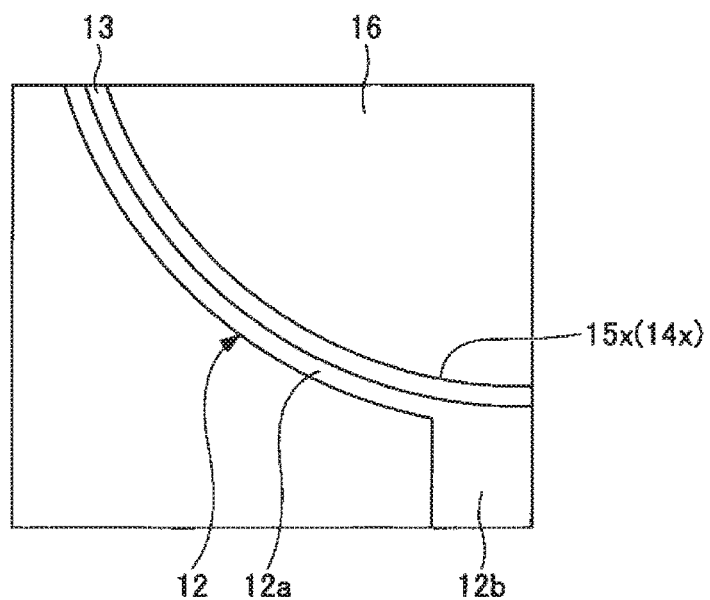
FIG. 1B is an enlarged view of area E of FIG. 1A.
Figure 2A:
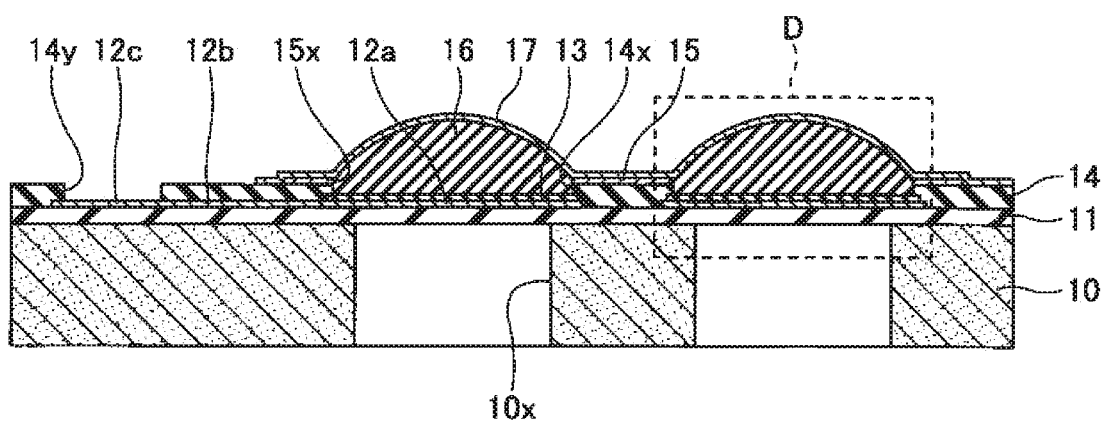
FIGS. 2A through 2C are cross-sectional views of the electromechanical transducer according to the first embodiment.
Figure 2B:
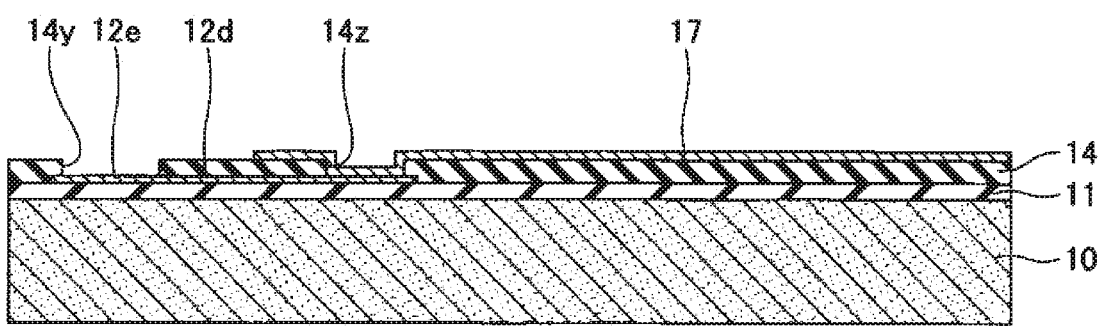
Figure 2C:
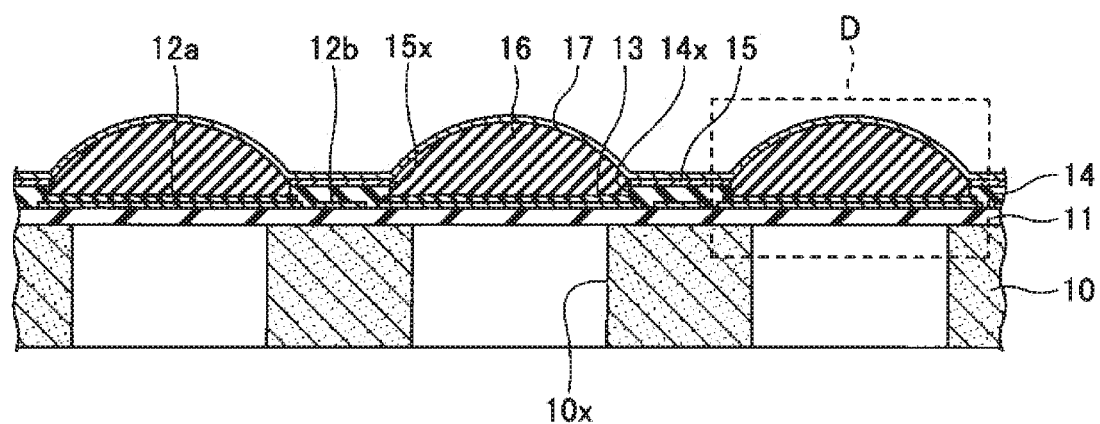
Figure 3A:
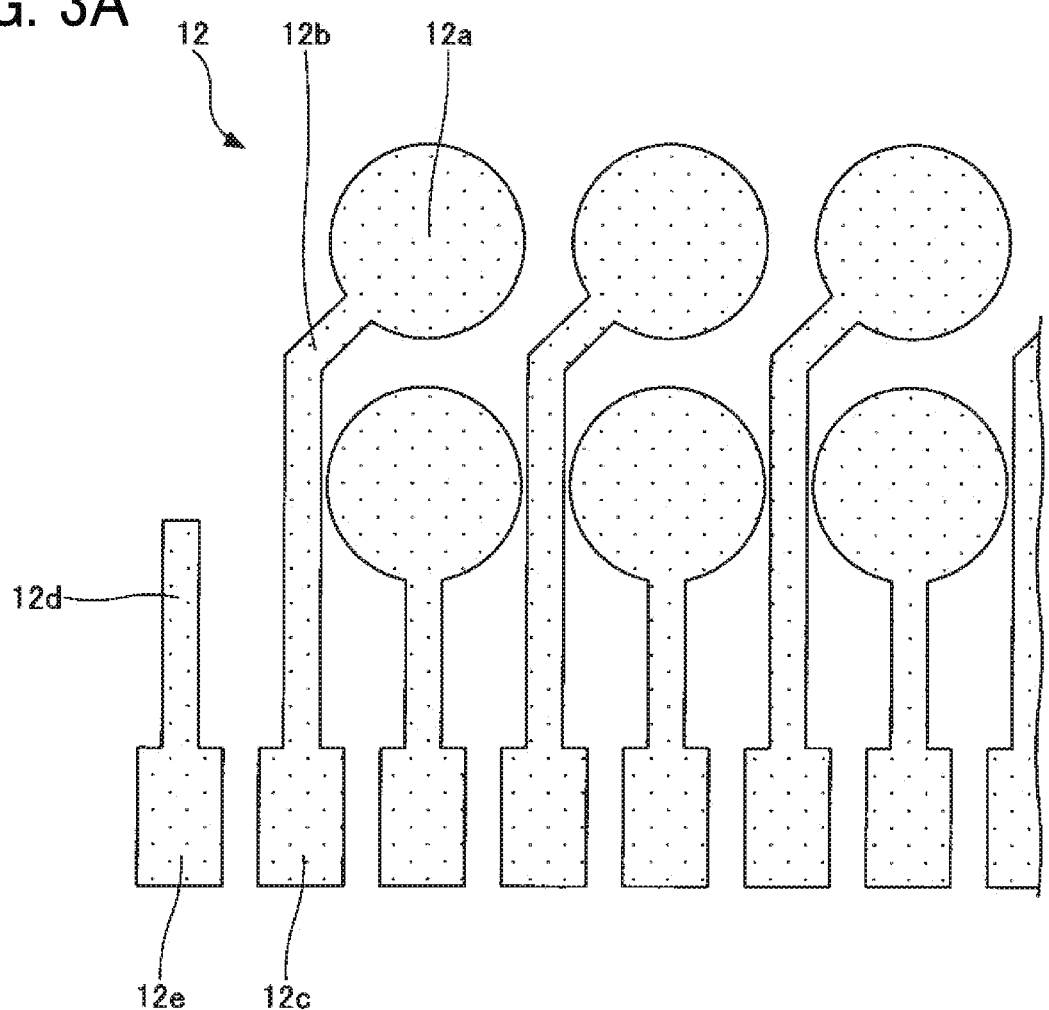
FIGS. 3A and 3B are plan views of layers constituting the electromechanical transducer according to the first embodiment.
Figure 3B:
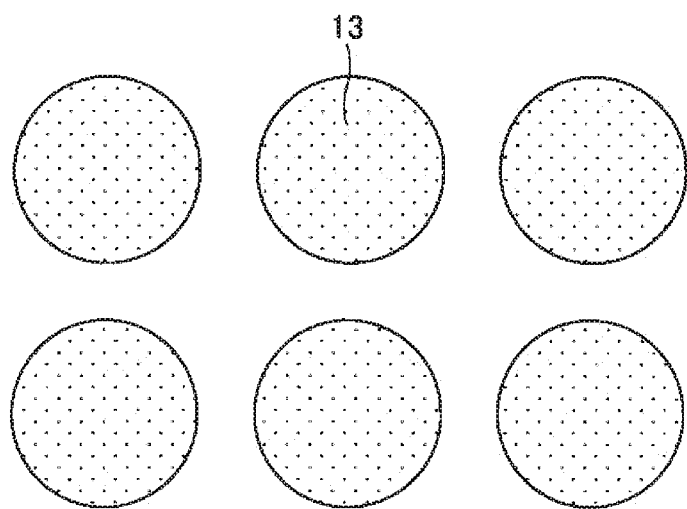
Figure 4A:
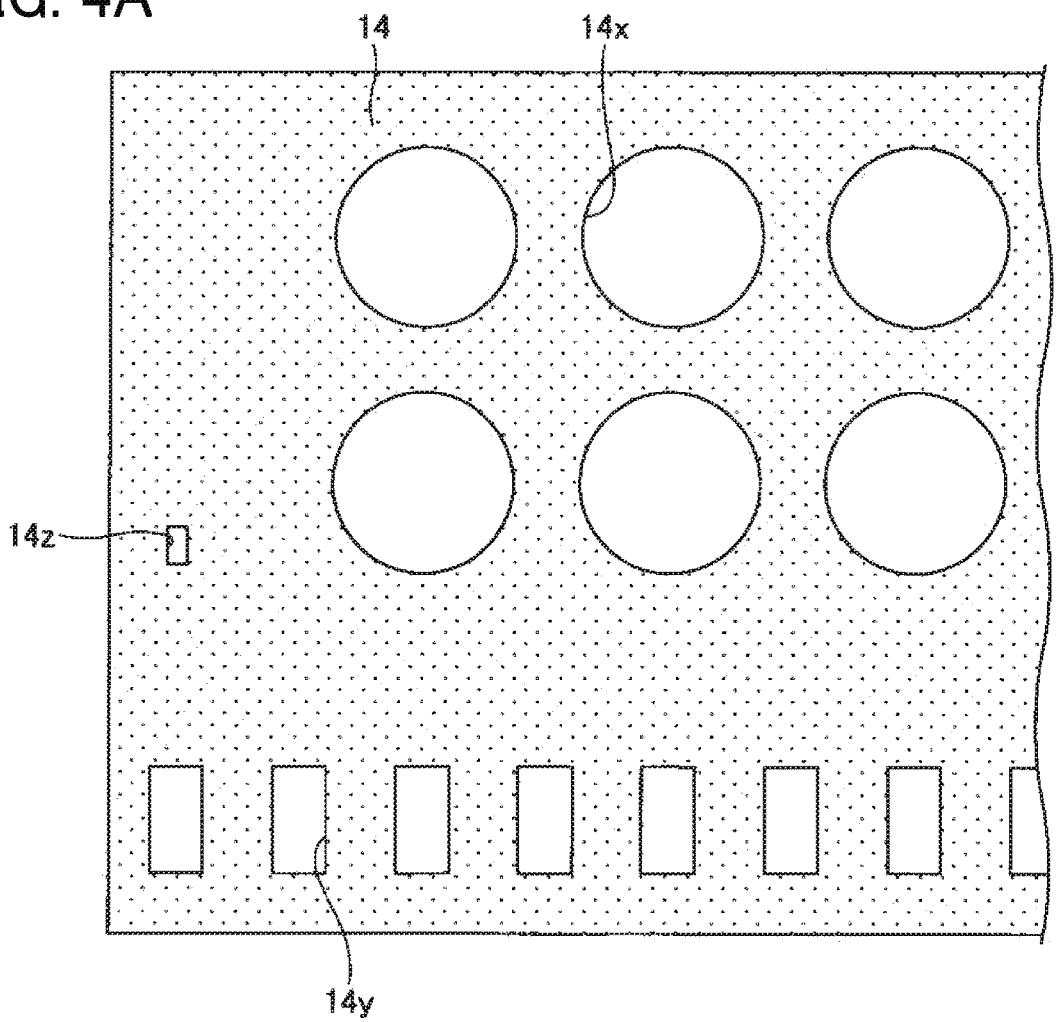
FIGS. 4A and 4B are plan views of layers constituting the electromechanical transducer according to the first embodiment.
Figure 4B:
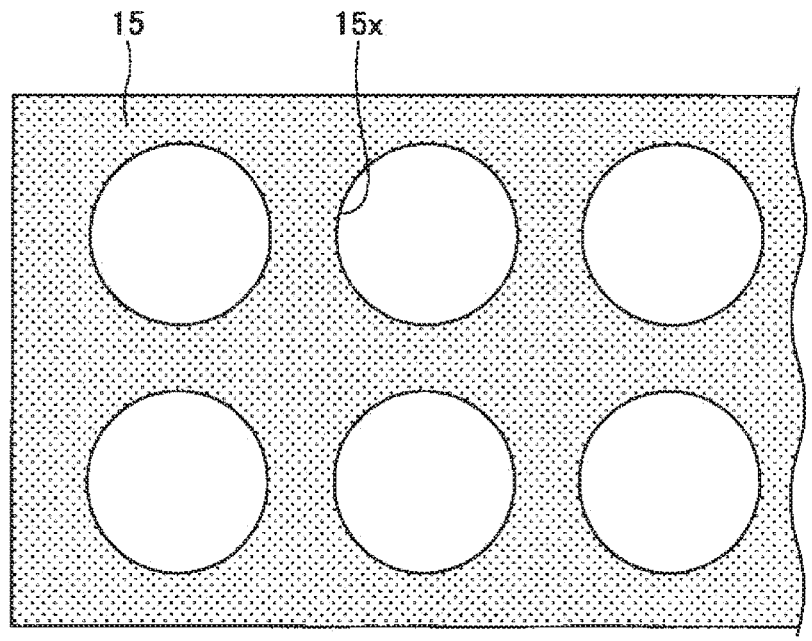
Figure 5A:
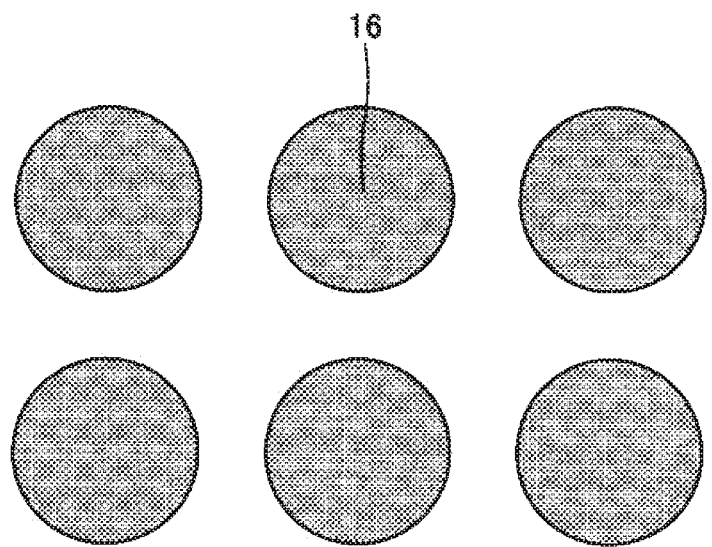
FIGS. 5A and 5B are plan views of layers constituting the electromechanical transducer according to the first embodiment.
Figure 5B:
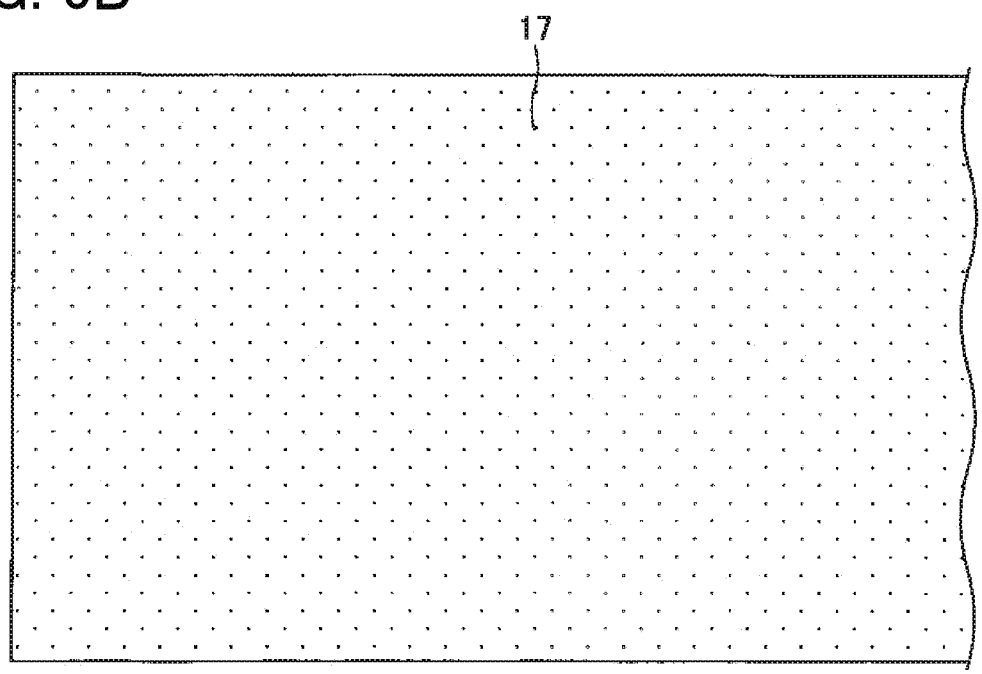

FIG. 1A is a plan view of an electromechanical transducer according to a first embodiment of the present disclosure. FIG. 1B is an enlarged view of area E of FIG. 1A. In FIG. 1B is illustrated a positional relationship between outer peripheries of a first conductive film 12, a ceramic film 13, and an electromechanical transducer film 16. Other components may be omitted. FIGS. 2A, 2B, and 2C are cross-sectional views of the electromechanical transducer according to the first embodiment. FIG. 2A is a cross-sectional view of the electromechanical transducer cut along line A-A of FIG. 1A. FIG. 2B is a cross-sectional view of the electromechanical transducer cut along line B-B of FIG. 1A. FIG. 2C is a cross-sectional view of the electromechanical transducer cut along line C-C of FIG. 1A. FIGS. 3A through FIG. 5B are plan views of a plurality of layers constituting the electromechanical transducer according to the first embodiment. FIG. 3A is a plan view of the first conductive film 12. FIG. 3B is a plan view of the ceramic film 13. FIG. 4A is a plan view of a second insulation film 14. FIG. 4B is a plan view of a second conductive film 15. FIG. 5A is the electromechanical transducer film 16. FIG. 5B is a plan view of an upper electrode 17.

Note that, in each drawing, a portion of the electromechanical transducer is illustrated for convenience. Actually, a larger number of electromechanical transducer elements may be disposed. Among the drawings, the scale is not necessarily uniform for convenience. In the following descriptions, the terms "upper" and "lower" correspond to "upper" and "lower", respectively, in FIGS. 2A through 2C.

In FIGS. 1A through 5B, the electromechanical transducer 1 includes a substrate 10, a first insulation film 11, the first conductive film 12, the ceramic film 13, the second insulation film 14, the second conductive film 15, the electromechanical transducer film 16, and the upper electrode 17. Note that the second insulation film 14 is a typical example of insulation film in embodiments of the present disclosure and the second conductive film 15 is a typical example of conduction film in embodiment of the present disclosure.

In the electromechanical transducer 1, a plurality of electromechanical transducer elements D is disposed on the substrate 10. In FIG. 1A, six electromechanical transducer elements D are illustrated. However, the number of electromechanical transducer elements is not limited to the example of FIG. 1A and the electromechanical transducer 1 may include any other suitable number of electromechanical transducer elements D.

Note that components (not including the substrate 10) disposed in an area defined by a broken line on the substrate 10 constitute the single electromechanical transducer element D. However, the electromechanical transducer element D is capable of functioning as a transducer element if the electromechanical transducer element D includes at least the lower electrode 12a, the electromechanical transducer film 16, and the upper electrode 17. Other components may be included in the electromechanical transducer element D as needed. The substrate 10 is a component acting as a support body on which each layer is to be formed. As the substrate 10, for example, a silicon substrate may be used. As the substrate 10, for example, an insulator substrate, such as a sapphire substrate, may be used. The thickness of the substrate 10 may be, for example, approximately 200 μm to approximately 600 μm.

The first insulation film 11 is formed on the substrate 10. As the first insulation film 11, for example, a silicon oxide film ($SiO_2$ film) may be used. The film thickness of the first insulation film 11 may be, for example, approximately 400 nm to approximately 800 nm. The first insulation film 11 is a film to insulate the substrate 10 from the first conductive film 12. Therefore, when an insulator substrate is used as the substrate 10, the first insulation film 11 is optional.

The first conductive film 12 is formed on the first insulation film 11. The first conductive film 12 includes a plurality of units, each of which is an integrated unit of a lower electrode 12a, wiring 12b, and a lower electrode terminal 12c. The number of the units corresponds to the number of the electromechanical transducer films 16. The lower electrode 12a is an individual electrode corresponding to each electromechanical transducer element D. The first conductive film 12 includes one unit in which the wiring 12b and an upper electrode terminal 12e are integrally formed. In the example illustrated in FIG. 3A, the unit is disposed at the leftmost side. The lower electrode 12a is exposed from an opening 14x of the second insulation film 14. The lower electrode terminal 12c and the upper electrode terminal 12e are exposed from an opening 14y of the second insulation film 14.

As a material of the first conductive film 12, for example, a lamination film can be used in which a platinum film (Pt film) is formed on a titanium dioxide film ($TiO_2$ film). The film thickness of the titanium dioxide film ($TiO_2$ film) may be, for example, approximately 50 nm to approximately 150 nm. The film thickness of the platinum film (Pt film) may be, for example, approximately 150 nm to approximately 250 nm. The titanium dioxide film ($TiO_2$ film) can enhance the cohesion of the platinum film (Pt film) and the first insulation film 11.

The ceramic film 13 is formed on the lower electrodes 12a of the first conductive film 12. The ceramic film 13 is preferably made of, for example, lead titanate ($PbTiO_3$) or lead zirconate titanate (PZT) rich in lead titanate. The film thickness of the ceramic film 13 may be, for example, approximately 60 nm to approximately 100 nm.

When the ceramic film 13 is made of lead titanate ($PbTiO_3$) or lead zirconate titanate (PZT) rich in lead titanate, good crystallinity can be obtained in the electromechanical transducer film 16 formed on the ceramic film 13. As a result, properties of the electromechanical transducer film 16 can be improved and the performance of the electromechanical transducer 1 can be enhanced. Note that the ceramic film 13 may be provided as needed.

The second insulation film 14 is formed on the ceramic film 13. As the second insulation film 14, for example, a silicon oxide film ($SiO_2$ film) may be used. The film thickness of the second insulation film 14 may be, for example, approximately 0.1 μm to approximately 1.2 μm. The second insulation film 14 includes the opening 14x of a round shape to expose an area of the ceramic film 13 on which the electromechanical transducer film 16 is formed, the opening 14y of a rectangular shape to expose the lower electrode terminal 12c and the upper electrode terminal 12e, and an opening 14z of a rectangular shape to expose the wiring 12d. Note that the shape of each opening may be a different shape as needed.

The second conductive film 15 is formed in an area surrounding the opening 14x on the second insulation film 14. The second conductive film 15 includes an opening 15x communicated with the opening 14x to expose the ceramic film 13. The open shape of the opening 14x is substantially the same as the open shape of the opening 15x. A plurality of sets of openings 14x and openings 15x may be discretely disposed.

As a material of the second conductive film 15, for example, a platinum group element, Ag, Au, or an alloy of at least two of the foregoing elements may be used. The second conductive film 15 may be a lamination film having a surface layer made of a platinum group element, Ag, Au, or an alloy of at least two of the foregoing elements. For example, a lamination film in which a platinum film (Pt film) having a film thickness of approximately 10 nm is formed on a titanium dioxide film ($TiO_2$ film) having a film thickness of approximately 10 nm. The second conductive film 15 acts as a foundation layer of a repellent film described later.

The electromechanical transducer film 16 is formed on the ceramic film 13 exposed in the opening 14x of the second insulation film 14 and the opening 15x of the second conductive film 15. The electromechanical transducer film 16 fills in the opening 14x and the opening 15x and projects beyond the surface of the second conductive film 15. The cross-sectional shape of the electromechanical transducer film 16 is, for example, a convex, curved shape (a portion of a spherical shape). The thickness of the electromechanical transducer film 16 may be, for example, approximately 1 μm in the opening 14x and the opening 15x and approximately 9 μm at a thickest portion projecting from the surface of the second conductive film 15 (i.e., approximately 10 μm in total).

Note that, in the present embodiment, as illustrated in FIG. 1B, the outer diameter shape meets a relation of the opening 14x=the opening 15x=the electromechanical transducer film 16<the ceramic film 13<the lower electrode 12a. However, the dimensional relationship between the ceramic film 13 and the lower electrode 12a is not limited to the above-described example, and any other suitable dimensional relationship can be selected according to an order in production process.

As a material of the electromechanical transducer film 16, an $ABO_3$-type material can be used. The $ABO_3$-type material is represented by a general formula $ABO_3$ and is a composite oxide including A=Pb, Ba, and Sr, and B=Ti, Zr, Sn, Ni, Zn, Mg, and Nb as main components. The $ABO_3$-type material is, for example, PZT or barium titanate.

Note that PZT is a solid solution of lead zirconate ($PbZrO_3$) and lead titanate ($PbTiO_3$) and has different properties according to the ratio of $PbZrO_3$ and $PbTiO_3$. For example, a PZT, in which the ratio of $PbZrO_3$ and $PbTiO_3$ is 53:47, can be used, which is represented by a chemical formula of $Pb(Zr_{0.53}, Ti_{0.47})O_3$ or generally represented as PZT (53/47).

The upper electrode 17 is formed on the electromechanical transducer films 16 projecting from the surface of the second conductive film 15, to serially cover the electromechanical transducer films 16. The upper electrode 17 is a common electrode for the plurality of electromechanical transducer films 16. The upper electrode 17 is formed in the opening 14z, is connected to the wiring 12d via the opening 14z, and is further connected to the upper electrode terminal 12e.

The upper electrode terminal 12e is exposed from the opening 14y of the second insulation film 14 and is electrically connectable to an outside. Similarly, the lower electrode terminals 12c corresponding to the respective electromechanical transducer films 16 are exposed from the openings 14y of the second insulation film 14 and are electrically connectable to an outside.

In an area corresponding to each of the electromechanical transducer films 16 in the substrate 10, a penetration portion 10x is disposed to expose a lower face of the first insulation film 11 formed as an under layer of each electromechanical transducer film 16. The penetration portion 10x forms a vibration portion of the electromechanical transducer film 16. The electromechanical transducer film 16 can be vibrated by applying voltage to between the lower electrode terminal 12c and the upper electrode terminal 12e. The vibration of the electromechanical transducer film 16 can be detected as a voltage from between the lower electrode terminal 12c and the upper electrode terminal 12e.

For example, when a voltage is applied to between the lower electrode terminal 12c and the upper electrode terminal 12e to vibrate the electromechanical transducer film 16, the first insulation film 11 under the electromechanical transducer film 16 displaces. Thus, an actuator employing the electromechanical transducer 1 can be provided. Such an actuator can be used as a supersonic generating actuator, which is used as a supersonic probe or a sonar.

The electromechanical transducer film 16 is vibrated by displacement of the first insulation film 11, and the vibration is detected as a voltage from between the lower electrode terminal 12c and the upper electrode terminal 12e. Thus, a sensor using the electromechanical transducer 1 can be provided. Such a sensor can be used as, for example, an angular velocity sensor or an infrared sensor. As described above, the first insulation film 11 can function as diaphragm plate.

Note that, in a configuration in which the electromechanical transducer 1 does not include the ceramic film 13, the second insulation film 14 as a cover film is formed on the substrate 10 to serially cover the plurality of lower electrodes 12a and the second conductive film 15 is formed in a predetermined area on the second insulation film 14. The lower electrode 12a is exposed in the opening 14x of the second insulation film 14 and the opening 15x of the second conductive film 15. The electromechanical transducer film 16 projecting from the surface of the second conductive film 15 is formed on the lower electrode 12a exposed in the opening 14x and the opening 15x.

FIGS. 6A through 6F and 8A through 8D are illustrations of an example of the production process of the electromechanical transducer according to the first embodiment. The cross section corresponding to FIG. 2A is illustrated in FIGS. 6A through 6F and 8A through 8D. FIGS. 7A and 7B are plan views of examples of the shape of resist used in the production process of the electromechanical transducer according to the first embodiment.

Figure 6A:
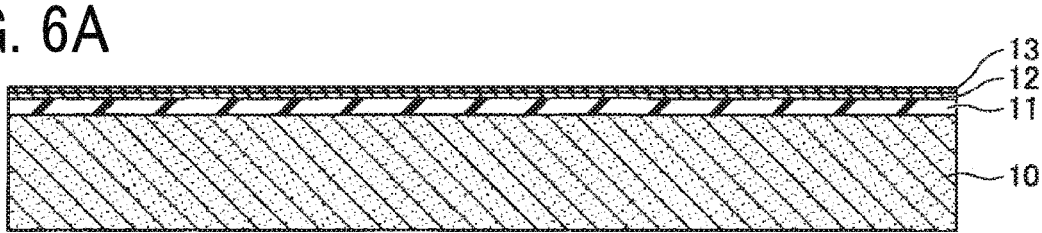
FIGS. 6A through 6F are illustrations of a production process of the electromechanical transducer according to the first embodiment.
Figure 7A:
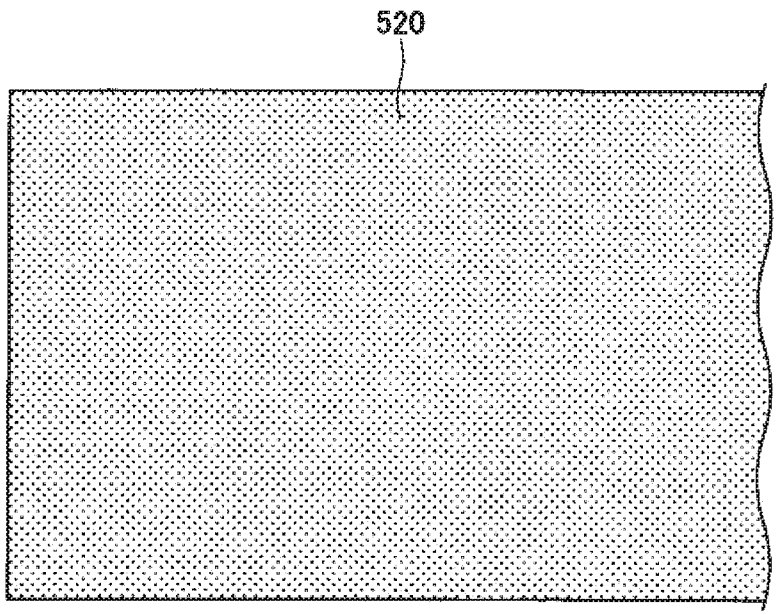
FIGS. 7A and 7B are plan views of examples of the shape of resist used in the production process of the electromechanical transducer according to the first embodiment.
Figure 7B:
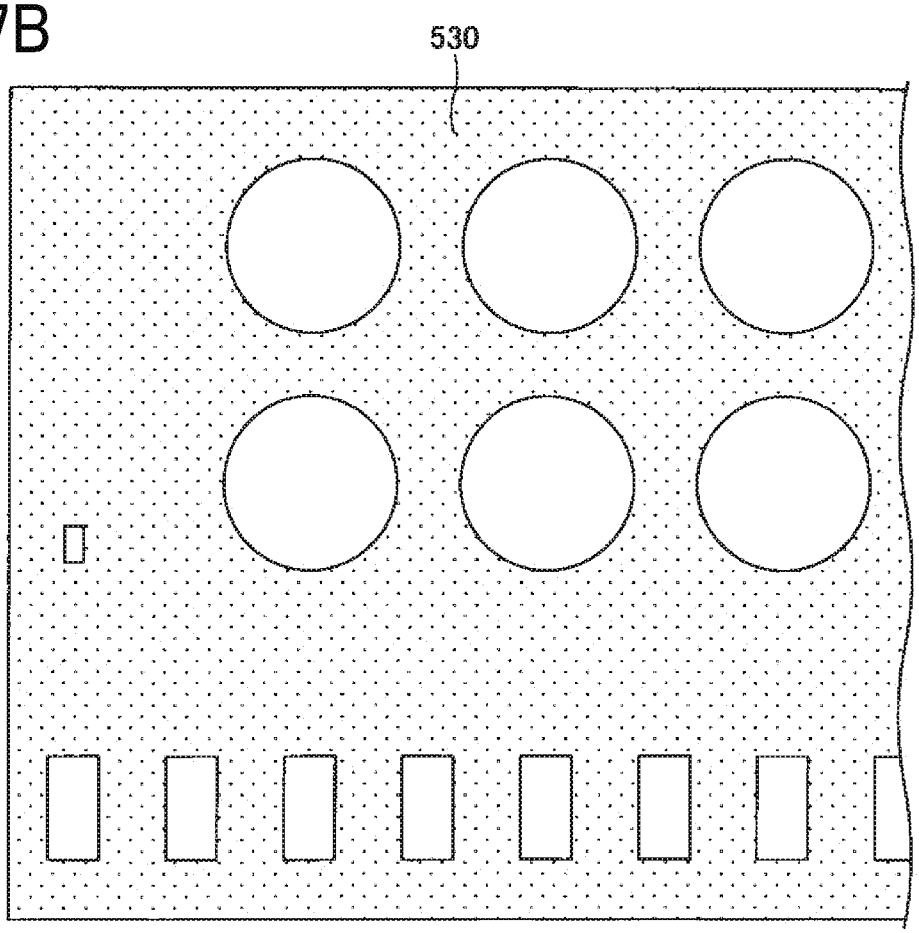

In the step illustrated in FIG. 6A, the substrate 10 is prepared and the first insulation film 11, the first conductive film 12, and the ceramic film 13 are laminated one on another on the substrate 10. In the present embodiment, a description is given of an example in which a silicon substrate is used as the substrate 10. As the first insulation film 11, for example, the substrate 10 being a silicon substrate can be thermally oxidized to form a silicon oxide film.

The first conductive film 12 may be, for example, a lamination film in which a platinum film (Pt film) is formed on a titanium dioxide film (TiO$_2$ film). In such a case, for example, first, a titan (Ti) film is formed (e.g., at a thickness of approximately 60 nm) on the first insulation film 11 by sputtering. Then, the titan (Ti) film is heated and oxidized by a rapid thermal annealing (RTA) apparatus in which oxygen is flown inside, to from a titanium dioxide (TiO$_2$) film of approximately 100 nm. A platinum film is formed (at a thickness of, for example, approximately 200 nm) by sputtering.

When lead titanate is used as the ceramic film 13, a precursor solution prepared from lead acetate and titanium alkoxide as starter materials are spin-coated on the first conductive film 12 (e.g., the platinum film) and a coating film is formed by the CSD method. Then, the coating film is dried, thermally decomposed, and crystallized to from the ceramic film 13.

Figure 6B:
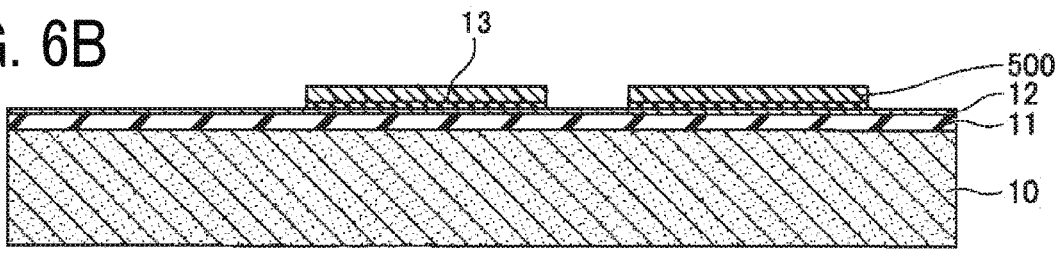

Next, in the step illustrated in FIG. 6B, the ceramic film 13 is patterned into a desired shape (e.g., a shape illustrated in FIG. 3B). For example, a resist 500 having a predetermined shape is formed on the ceramic film 13 by photolithography. The ceramic film 13 exposed from the resist 500 is removed by etching and the ceramic film 13 is patterned into a desired shape. Etching is performed by, for example, wet etching using fluonitric acid. Then, the resist 500 is removed.

Figure 6C:
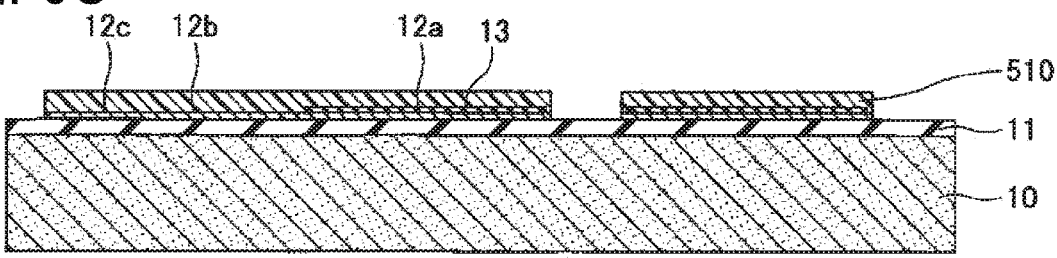

Next, in the step illustrated in FIG. 6C, the first conductive film 12 is patterned into a desired shape (e.g., a shape illustrated in FIG. 3A) to form the lower electrode 12a, the wiring 12b, the lower electrode terminal 12c, the wiring 12d, and the upper electrode terminal 12e.

For example, a resist 510 having a predetermined shape is formed on the first conductive film 12 by photolithography. The first conductive film 12 exposed from the resist 510 is removed by etching and the first conductive film 12 is patterned into a desired shape. Etching can be performed with, for example, chlorine gas by a dry etcher using inductive coupling plasma (ICP) as a plasma source. Then, the resist 510 is removed.

Figure 6D:
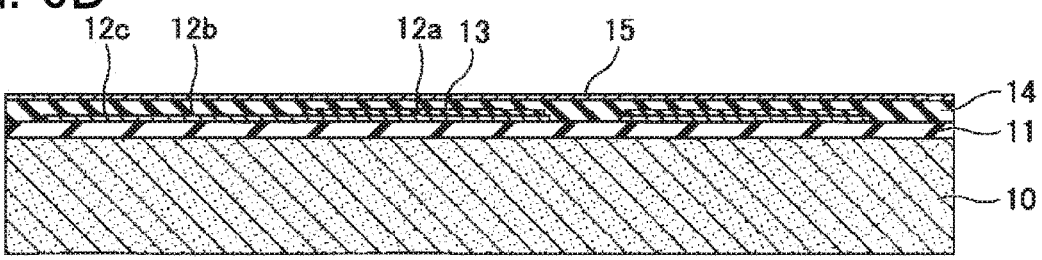

Next, in the step illustrated in FIG. 6D, the second insulation film 14 as a cover film is formed to serially cover the lower electrode 12a, the wiring 12b, the lower electrode terminal 12c, the wiring 12d, and the upper electrode terminal 12e. In addition, the second conductive film 15 is formed on the second insulation film 14.

When a silicon oxide film (SiO$_2$ film) is used as the second insulation film 14, a silicon oxide film is formed at a thickness of approximately 1 μm by, e.g., a normal atmospheric pressure CVD method, a reduced pressure CVD method, or a plasma CVD method. When a lamination film in which a platinum film (Pt film) is formed on a titanium dioxide film (TiO$_2$ film) is used as the second conductive film 15, the lamination film can be formed in a similar manner to the manner in the first conductive film 12. In such a case, the thickness of each of the titanium dioxide film (TiO$_2$ film) and the platinum film (Pt film) may be approximately 10 nm.

Figure 6E:
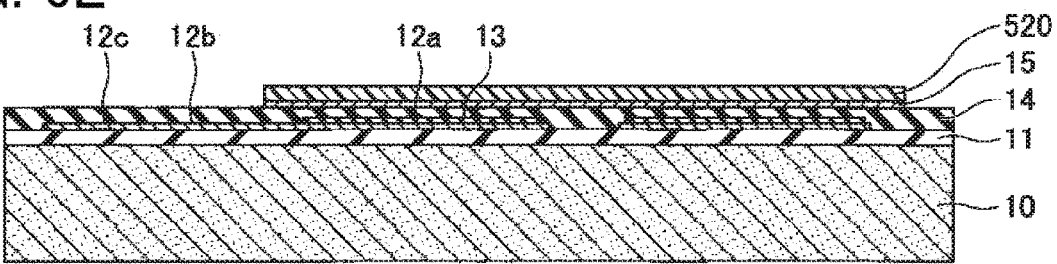

Next, in the step illustrated into FIG. 6E, the second conductive film 15 is patterned into a desired shape (e.g., a state before the opening 15x is formed into a shape illustrated in FIG. 4B). For example, a resist 520 having a planar shape illustrated in FIG. 7A is formed on the second conductive film 15 by photolithography. Then, the second conductive film 15 exposed from the resist 520 is removed by etching and the second conductive film 15 is patterned into a desired shape. Etching can be performed with, for example, chlorine gas by a dry etcher using ICP as a plasma source. Then, the resist 520 is removed.

Figure 6F:
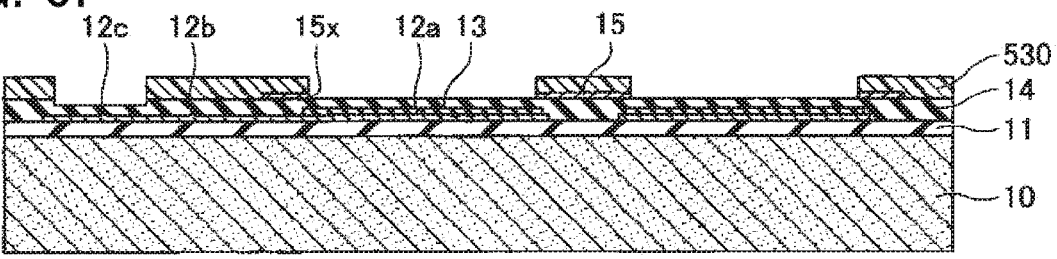

Next, in the step illustrated in FIG. 6F, the second conductive film 15 is patterned again into a desired shape (e.g., the shape illustrated in FIG. 4B). For example, a resist 530 having a shape illustrated in FIG. 7B is formed on the second conductive film 15 by photolithography. Then, the second conductive film 15 exposed from the resist 530 is removed by etching and the second conductive film 15 is patterned into a desired shape. Etching can be performed with, for example, chlorine gas by a dry etcher using ICP as a plasma source. Here, the resist 530 is not removed.

Figure 8A:
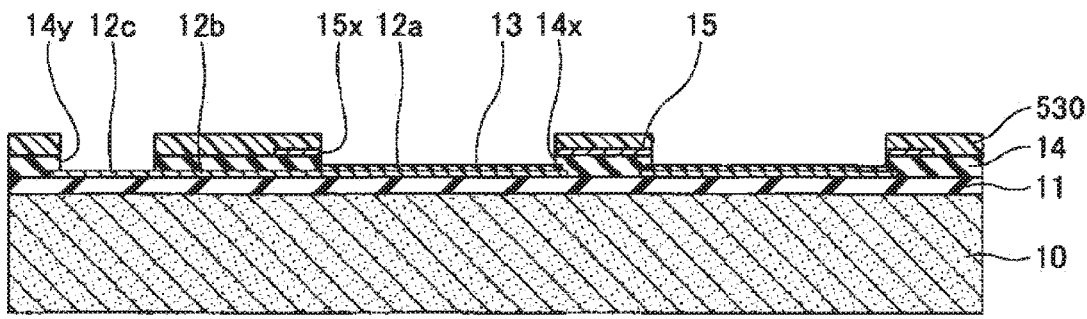
FIGS. 8A through 8D are illustrations of the production process of the electromechanical transducer according to the first embodiment.

Next, in the step illustrated in FIG. 8A, the second insulation film 14 is patterned into a desired shape (e.g., the shape illustrated in FIG. 4A). For example, the second insulation film 14 exposed from the resist 530 is removed by etching and the second insulation film 14 is patterned into a desired shape. Etching can be performed with a mixture of CHF and $CHF_3$ in a reactive ion etching (RIE) apparatus. In the step illustrated in FIG. 6F, different portions in thickness are formed in the second insulation film 14. However, since a selection ratio relative to an under layer is sufficiently secured in the etching of the second insulation film 14, there is no particular problem.

Note that, although similar with the preceding steps, the thickness of the resist used in the steps illustrated in FIG. 6F and FIG. 8A is enough if a step of a processed surface can be filled and a sufficient resistance to the etching is obtained by the thickness. In the two steps, the thickness of the resist formed is sufficient to be a thickness of approximately 2.5 µm.

For example, when the thickness of the first conductive film 12 is approximately 300 nm and the thickness of the ceramic film 13 is approximately 80 nm, a step of a foundation is a total of approximately 500 nm due to scraping of the foundation in over-etching. When a lamination film in which a platinum film is formed on a titanium dioxide film (the thickness of each film is 10 nm) is used as the second conductive film 15, the film decrease amount of the resist in etching is slight since the thickness of an etching target is thin in etching.

When a silicon oxide film having a thickness of 1 µm is used as the second insulation film 14, at least approximately 1.5 is obtained as the selection ratio relative to the resist, though depending on the apparatus and conditions. Therefore, it is sufficient to expect approximately 700 nm to approximately 800 nm as the film decrease amount of the resist even if a decrease amount in over-etching is included.

Thus, the thickness of the resist used is preferably approximately 2.5 µm by adding a sufficient surplus to the size of the step and the film decrease amount in etching. The resist having such a thickness is used in, e.g., a normal micro electro mechanical systems (MEMS) process and has no problems in productivity.

Though the processing accuracy largely depends on the processing apparatus and conditions used, the accuracy of approximately ±1.0 µm including the accuracy of etching is obtained even if a relatively reasonable apparatus generally used in, e.g., a MEMS process is used. If a higher-accuracy processing apparatus is used, processing can be performed with further higher accuracy.

Figure 8B:
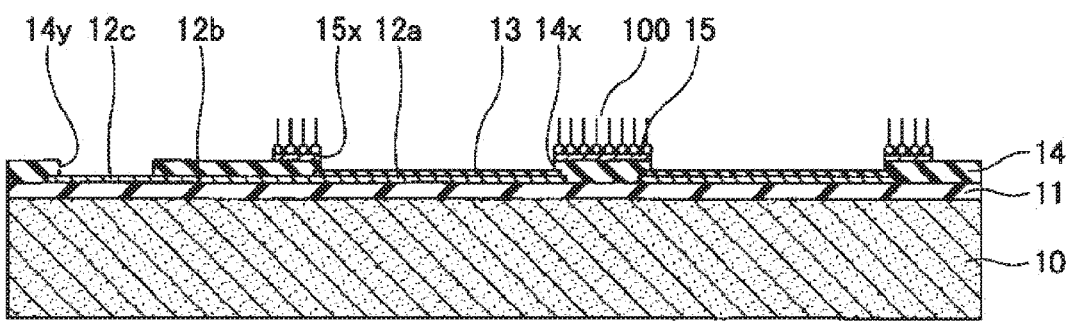

Next, in the step illustrated in FIG. 8B, a repellent film 100 is formed on the second conductive film 15. The repellent film 100 is a self-organized mono-molecular film (self-assembled monolayer) utilizing a phenomenon in which alkanethiol self-assembles on a certain metal. To form the repellent film 100, first, surface treatment (surface purification) is performed as pretreatment (acid washing) on the second conductive film 15. A diluent of an organic solvent (e.g., alcohol, acetone, or toluene) of alkanethiol is spin-coated on an entire surface including the surface of the second conductive film 15. Note that, to enhance hydrophobicity, a liquid containing fluorine as the diluent is preferably used.

Next, megasonic washing by an organic solvent (e.g., alcohol, acetone, or toluene) is performed to remove an extra repellent film formed on an area other than the second conductive film 15. Accordingly, the repellent film 100 is formed on the surface of the second conductive film 15 and the surface of the second conductive film 15 is turned to be hydrophobic. By contrast, the repellent film 100 is not formed on the ceramic film 13 and the second insulation film 14. The ceramic film 13 and the second insulation film 14 are maintained as hydrophilic portion (CSD affinity portion).

As described above, the surface of the second conductive film 15 can be turned to be hydrophobic by the surface treatment using a thiol compound solution and the formation of the self-organized film of the thiol compound solution. Accordingly, even when thin electromechanical transducer films are repeatedly laminated to form a thick film, the patterning of the repellent film 100 in each of the laminations steps can be performed in a mask-less manner, thus allowing the electromechanical transducer film 16 to be produced crack-flee at relatively low cost.

Figure 8C:
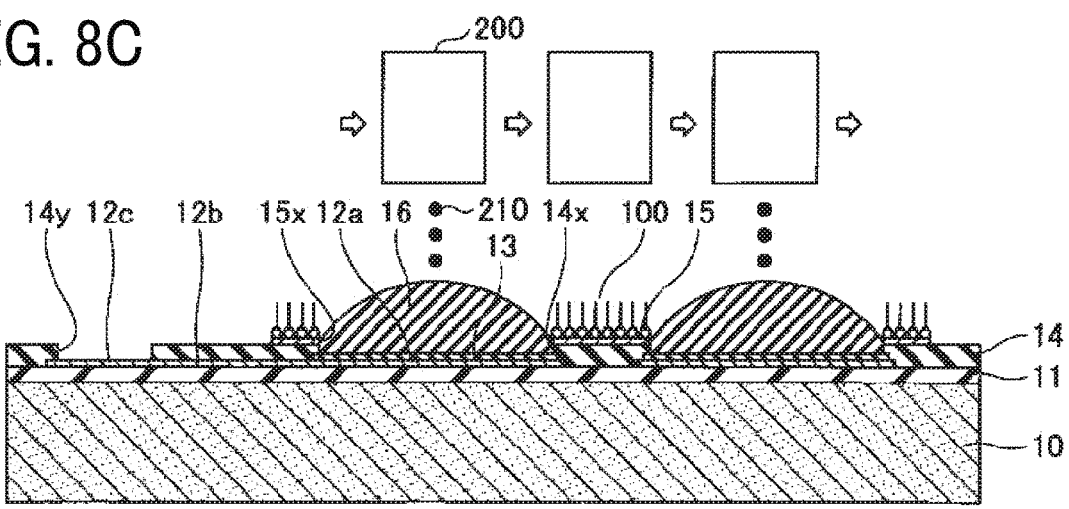

Next, in the step illustrated in FIG. 8C, the electromechanical transducer films 16 projecting from the surface of the second conductive film 15 are formed on the ceramic films 13 exposed in the openings 14x and the openings 15x. For example, first, according to an inkjet method using a liquid discharge apparatus including the liquid discharge head 200, precursor solution (CSD liquid) of the electromechanical transducer film 16 is selectively coated on the ceramic films 13 exposed in the opening 14x of the second insulation film 14 and the opening 15x of the second conductive film 15, to form coating films. When PZT is used as the electromechanical transducer film 16, the precursor solution can be synthesized by dissolving, for example, lead acetate, zirconium alkoxide, or titanium alkoxide compound as starter material into methoxy ethanol as common solvent.

While the liquid discharge head 200 of the liquid discharge apparatus moves above the substrate 10 (or the substrate 10 moves below the liquid discharge head 200), the precursor solution is discharged as liquid 210 only when the relative positions of the liquid discharge head 200 and the substrate 10 are at predetermined positions. Thus, the precursor solution is selectively applied to only a desired portion to form the coating film.

Note that, when the surface wettability of the substrate 10 on which the precursor solution is applied is not controlled, the shape of coating pattern of the precursor solution may vary with a variation in landing position of the liquid 210 or a variation in distribution state of wetness. To prevent such a variation, for the present embodiment, in the step illustrated in FIG. 8B, the surface of a portion on which the precursor solution is to be coated is hydrophilic and the surface of the outer circumference of the coated portion is turned to be hydrophobic in advance. When the liquid 210 is coated on the substrate 10 in such a surface state, the precursor solution can be coated on the entire hydrophilic area with the precursor solution not coated on the hydrophobic area even when the landing position of the liquid 210 slightly varies.

Next, by heating the coating film, the coating film is dried, thermally-decomposed, and crystallized. At this time, the repellent film 100 is eliminated. By adjusting the application amount of the precursor solution, the crystallized film is adjusted to have a thickness of approximately 100 nm. The greater the film thickness formed one time, the greater the productivity. However, the greater the film thickness, the more a crack is likely to occur. In the present embodiment, the crystallized film is adjusted to have a thickness of approximately 100 nm.

In addition, the process of the formation of the repellent film 100 on the second conductive film 15, the selective coating of the precursor solution, the drying, thermal decomposition, and crystallization of the coating film by heating is repeated until a desired thickness of the electromechanical transducer film 16 is obtained. By repeating the above-described process, for example, approximately 100 times, the electromechanical transducer film 16 having a thickness of approximately 10 μm can be formed. Note that, when high accuracy is required for the thickness of the electromechanical transducer film 16, the thickness may be measured on the course of the formation of the electromechanical transducer film 16. Based on the measurement result, the number of additional lamination processes may be adjusted.

According to the formation method, the planar shape and accuracy of the area on which the precursor solution is coated are determined by the shape and accuracy of the opening 14x of the second insulation film 14 and the opening 15x of the second conductive film 15 on which the electromechanical transducer films 16 are formed. The accuracy of processing of the second insulation film 14 and the second conductive film 15 is approximately ±1.0 μm. Accordingly, the two-dimensional coating accuracy of the precursor solution (and the accuracy of processing of the electromechanical transducer film 16) can be adjusted to be approximately ±1.0 μm.

In addition, the three-dimensional shape of the surface of the precursor solution coated is uniquely determined by the surface tension of liquid. In the present embodiment, since the two-dimensional shape of the electromechanical transducer film 16 is round, the upper surface of the electromechanical transducer film 16 is part of a spherical shape. Accordingly, a highly accuracy shape including the three-dimensional shape can be obtained as the shape of coating of the precursor solution (and the shape of the electromechanical transducer film 16).

Figure 8D:
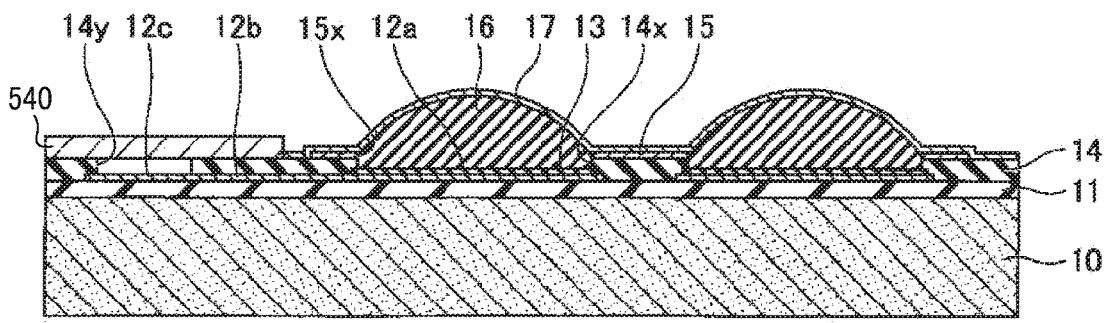

Next, in the step illustrated in FIG. 8D, the upper electrode 17 is formed to serially cover the electromechanical transducer films 16 projecting from the surface of the second conductive film 15. For example, using a solid mask 540, such as a metal mask, a film of the upper electrode 17 is formed only at openings of the solid mask 540 by, e.g., sputtering. As the upper electrode 17, for example, a lamination film in which a gold (Au) film is laminated on a chromium (Cr) film can be formed by vapor deposition. In such a case, the film thickness of the Cr film may be, for example, approximately 50 nm, and the film thickness of the Au film is, for example, approximately 200 nm.

Since the pattern of the upper electrode 17 may cover a substantially entire area of the element except for the upper electrode terminal 12e, the accuracy required for the pattern is not so high. For example, it is sufficient that the pattern of the upper electrode 17 is not formed on the upper electrode terminal 12e while the upper electrode 17 covers the entire surface of the electromechanical transducer film 16 and the portions corresponding to the openings 14z. As far as the margin of the width is secured, the pattern accuracy does not matter even with mask deposition. Note that the term "mask deposition" means a method of covering a predetermined area with a mask and forming a film only by, e.g., sputtering on an area not covered with the mask.

After the step illustrated in FIG. 8D, etching is performed on a first surface of the substrate 10 opposite a second surface of the substrate 10 on which the electromechanical transducer films 16 are formed. Thus, the penetration portions 10x of the substrate 10 to be vibration portions of the electromechanical transducer films 16 are formed. The penetration portions 10x can be easily formed by dry etching using, for example, a deep silicon etcher having ICP as plasma source.

In the above-described process, the openings 14x and the openings 15x are formed in advance in the second insulation film 14 and the second conductive film 15, respectively, in which the electromechanical transducer films 16 are formed. Then, the electromechanical transducer films 16, which fill the openings 14x and the openings 15x and project from the surface of the second conductive film 15, are formed. Such a process can obviate the step of forming insulation films on the electromechanical transducer film having steps by photolithography and etching after formation of the electromechanical transducer film. In other words, since the step of using a thick film resist can be obviated, failures caused by using the thick film resist can be prevented, thus reducing the production cost of the electromechanical transducer 1. Note that the term "thick film resist" used herein refers to a resist having a film thickness of 10 μm or greater after coating. When the resist film having such a thickness is formed by spin coating, a resist having a viscosity of 400 Pa or higher is typically used.

The lower electrode 12a is an individual electrode and the upper electrode 17 is a common electrode. Such a configuration obviates the patterning of the upper electrode 17 (since the patterning using the thick film resist is obviated), thus also allowing a reduction in production cost of the electromechanical transducer 1.

In addition, the processing accuracy of the opening 14x of the second insulation film 14 and the opening 15x of the second conductive film 15 is excellent (for example, approximately ±1.0 μm), thus allowing formation of the electromechanical transducer film 16 at high accuracy. Further, since the process of photolithography and etching after formation of the electromechanical transducer film is obviated, the film thickness of the electromechanical transducer film 16 can be set to be thick without consideration of the occurrence of steps, thus allowing formation of the electromechanical transducer film 16 having high power. That is, the electromechanical transducer 1 including the electromechanical transducer film 16 of high accuracy and high power can be achieved.

Variation of First embodiment

As a variation of the first embodiment, a description is given below of an example in which a part of the production process of the first embodiment is changed. Note that, in the variation of the first embodiment, redundant descriptions may be omitted below of the same configurations as the configurations of the above-described embodiment.

Figure 9A:
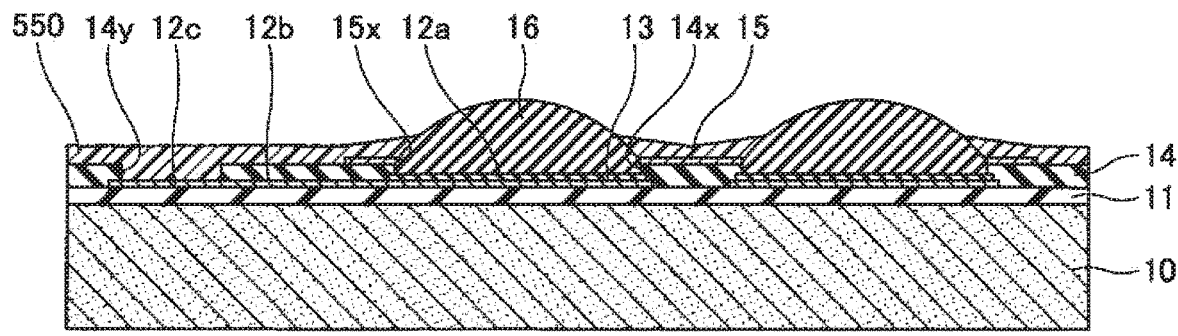
FIGS. 9A through 9C are illustrations of the production process of the electromechanical transducer according to a variation of the first embodiment.
Figure 9B:
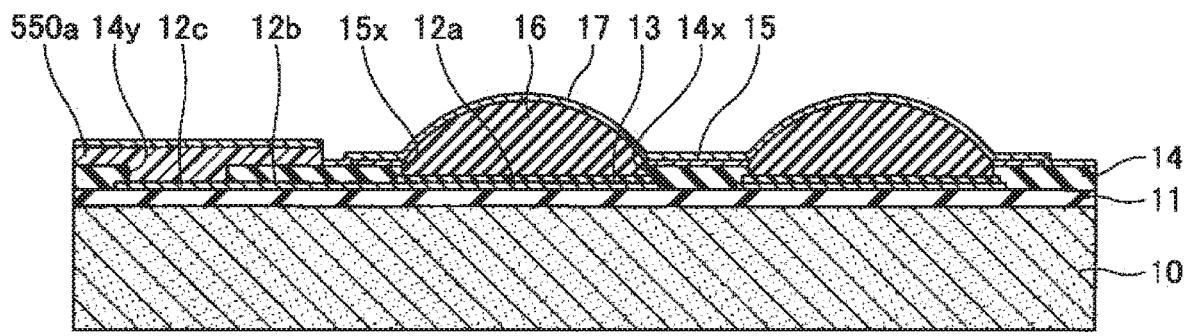
Figure 9C:
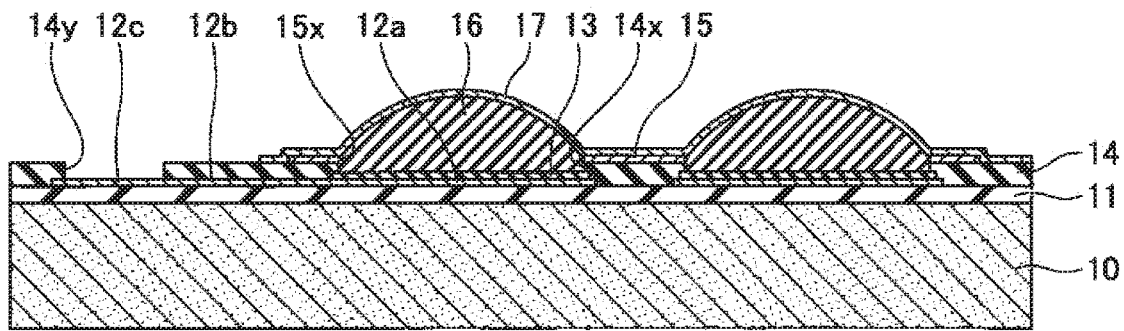

The upper electrode 17 can be formed by lift-off of the process illustrated in FIGS. 9A through 9C, instead of the mask deposition in the step illustrated in FIG. 8D in the production method described in the first embodiment.

For example, in the step illustrated in FIG. 9A, photoresist 550 is spin-coated on a structural body, on which the step illustrated in FIG. 8C has been finished, in a condition in which the photoresist 550 is coated at approximately 2 µm on a flat substrate. Since the electromechanical transducer film 16 has a large step (height difference) from a surrounding area, an upper portion of the electromechanical transducer film 16 may not be fully covered with the photoresist. However, since such an uncovered portion is removed by exposure and development, the uncovered portion does not matter. In addition, the thickness of the photoresist 550 may be uneven due to the step (height difference), which may reduce the accuracy of pattern. However, as described above, the accuracy required for the pattern is not so high, and the reduction in the accuracy does not matter.

Next, in the step illustrated in FIG. 9B, the photoresist 550 coated in the step illustrated in FIG. 9A is exposed and developed to form a resist pattern 550a, a film of the upper electrode 17 is formed on an entire upper surface including the surface of the resist pattern 550a. Note that the resist pattern 550a is formed on a portion on which the upper electrode 17 is to be finally removed. The material and thickness of the upper electrode 17 are, for example, the material and thickness in the step illustrated in FIG. 8D.

next, in the step illustrated in FIG. 9C, the resist pattern 550a illustrated in FIG. 9B is peeled with peeling liquid. Simultaneously, the film of the upper electrode 17 formed on the resist pattern 550a is lifted off. Then, etching is performed on a first surface of the substrate 10 opposite a second surface of the substrate 10 on which the electromechanical transducer films 16 are formed. Thus, the penetration portions 10x of the substrate 10 to be vibration portions of the electromechanical transducer films 16 are formed and thus the electromechanical transducer 1 is produced.

As described above, when the upper electrode 17 is formed by lift-off, failures caused by using a thick film resist can be prevented, thus reducing the production cost of the electromechanical transducer 1.

Second Embodiment

In a second embodiment of the present disclosure, a description is given of an example of an electromechanical transducer 2 including a passivation film 21 and a bump 22. Note that, in the second embodiment, redundant descriptions may be omitted below of the same configurations as the configurations of the above-described embodiment.

Figure 10:
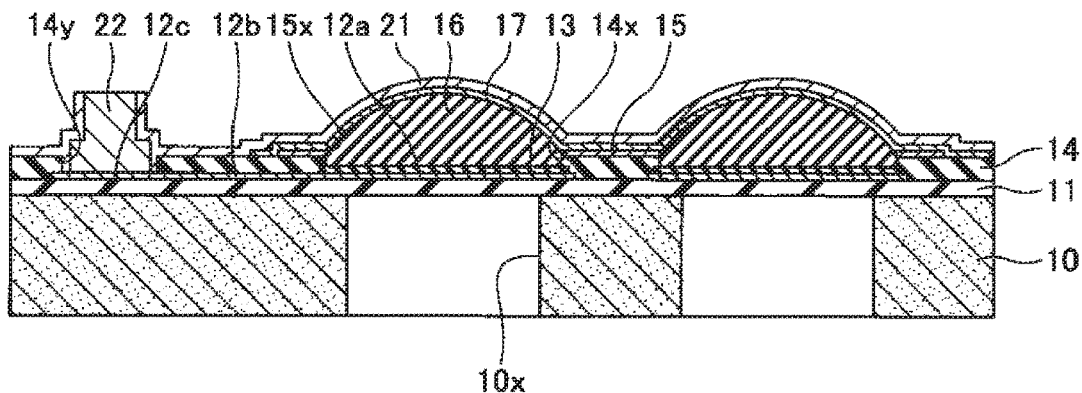
FIG. 10 is a cross-sectional view of the electromechanical transducer according to a second embodiment of the present disclosure.

FIG. 10 is a cross-sectional view of the electromechanical transducer 2 according to the second embodiment. In FIG. 10, a cross section corresponding to the cross section cut along line A-A of FIG. 1A is illustrated. As seen from FIG. 10, the electromechanical transducer 2 according to the second embodiment differs from the electromechanical transducer 1 (see, e.g., FIG. 2A) in which the electromechanical transducer 2 includes the passivation film 21 and the bump 22.

The passivation film 21 is formed to cover an entire upper surface of the electromechanical transducer 2 except for an upper surface of the bump 22. As the passivation film 21, for example, a silicon nitride film can be used. The film thickness of the passivation film 21 can be, for example, approximately 1 µm. As the bump 22, for example, a stud bump of gold can be used.

Figure 11A:
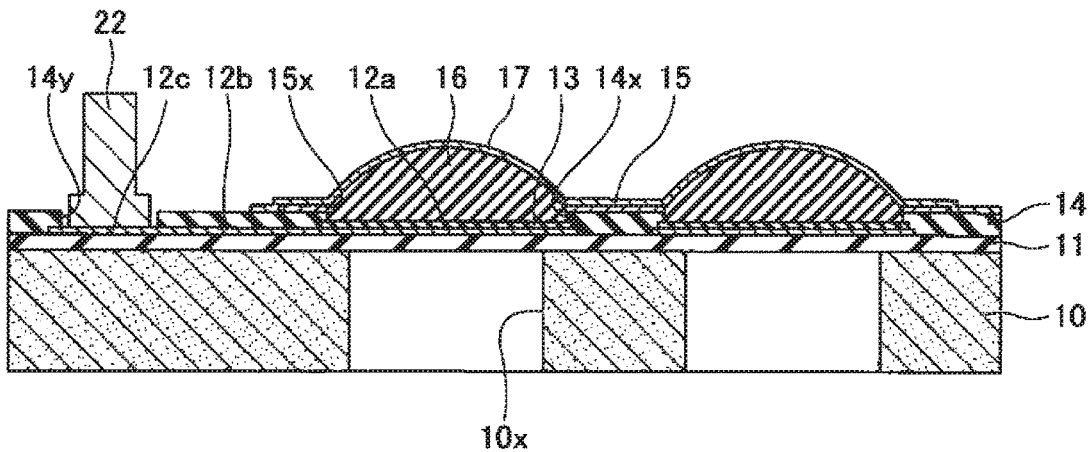
FIGS. 11A and 11B are illustrations of a production process of the electromechanical transducer according to the second embodiment.
Figure 11B:
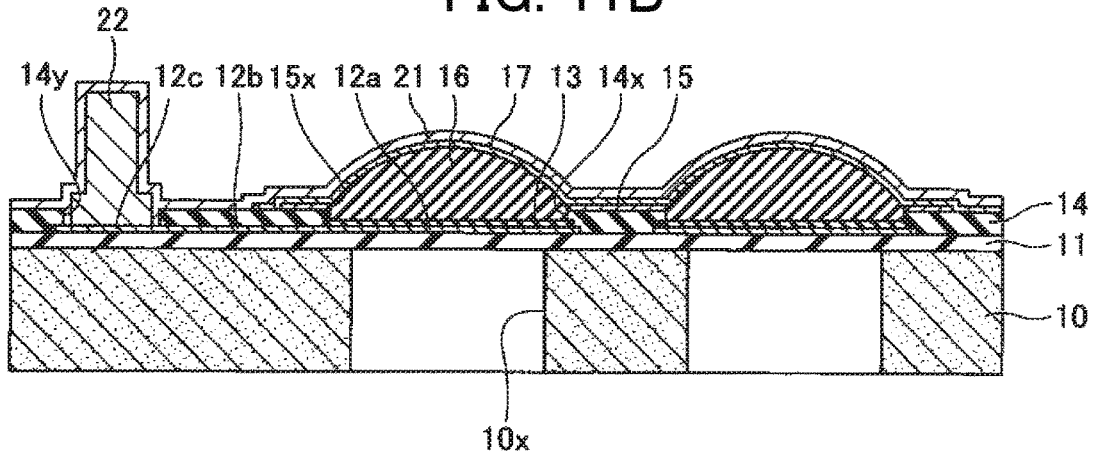

FIGS. 11A and 11B are illustrations of a production process of the electromechanical transducer 2 according to the second embodiment. In FIGS. 11A and 11B, a cross section corresponding to the cross section of FIG. 10 is illustrated. First, the entire process described in the first embodiment with reference to FIGS. 6A through 8D are performed. Then, in the step illustrated in FIG. 11A, the bumps 22 are formed on the lower electrode terminal 12c and the upper electrode terminal 12e. When the gold stud bump is formed as the bump 22, for example, a gold ball may be formed by heating a gold wire and bonded to the lower electrode terminal 12c and the upper electrode terminal 12e by supersonic assist. Then, the gold wire can be cut to form the gold stud bump.

Next, in the step illustrated in FIG. 11B, the passivation film 21 is formed to cover the entire upper surface of the structural body illustrated in FIG. 11A. As the passivation film 21, for example, a silicon nitride film having a film thickness of approximately 1 µm can be formed by a plasma CVD method.

After the step illustrated in FIG. 11B, a head portion of the bump 22 is compressed by a leveling apparatus. At this time, the passivation film 21 covering the upper surface of the bump 22 is simultaneously removed. As illustrated in FIG. 10, the upper surface of the bump 22 is exposed from the passivation film 21. Note that, even if, e.g., a broken piece of the passivation film 21 is partially left on the upper surface of the bump 22, it does not matter if electrical connection is achieved.

As described above, the bump may be formed on the lower electrode terminal and the upper electrode terminal and the passivation film may be formed on the electromechanical transducer film.

Third Embodiment

In the third embodiment, a description is given of an example of an electromechanical transducer 3 in which a common electromechanical transducer film 31 is employed instead of the second insulation film 14. Note that, in the third embodiment, redundant descriptions may be omitted below of the same configurations as the configurations of the above-described embodiments.

Figure 12:
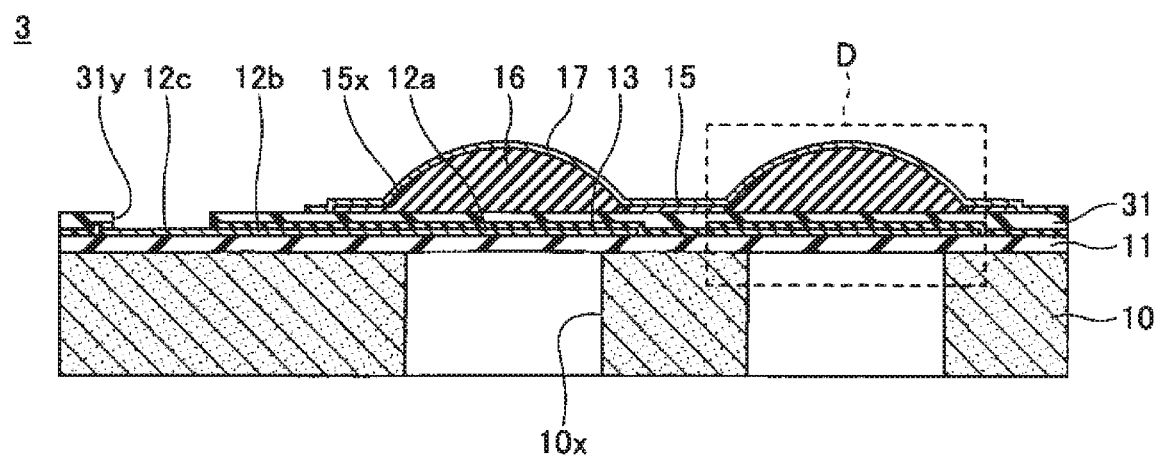
FIG. 12 is a cross-sectional view of the electromechanical transducer according to a third embodiment of the present disclosure.

FIG. 12 is a cross-sectional view of the electromechanical transducer according to the third embodiment. In FIG. 12, a cross section corresponding to the cross section cut along line A-A of FIG. 1A is illustrated. As seen from FIG. 12, the electromechanical transducer 3 differs from the electromechanical transducer 1 (see, e.g., FIG. 2A) in that the electromechanical transducer 3 includes the common electromechanical transducer film 31 instead of the second insulation film 14. The common electromechanical transducer film 31 is a cover film to serially cover the plurality of lower electrodes 12a and the plurality of ceramic films 13 formed on the substrate 10.

As a material(s) of the common electromechanical transducer film 31, for example, a material(s) similar to the material(s) of the electromechanical transducer film 16 can be used. The film thickness of the common electromechanical transducer film 31 can be, for example, approximately 2 µm. When the film thickness of the thickest portion of the electromechanical transducer film 16 is, for example, approximately 8 µm, the total thickness (thickness of the thickest portion) of the electromechanical transducer film 16 and the common electromechanical transducer film 31 is approximately 10 µm. A lamination portion of the common electromechanical transducer film 31 and the electromechanical transducer film 16 contributes to vibration.

The common electromechanical transducer film 31 includes no openings corresponding to the openings 14x of the second insulation film 14. The common electromechanical transducer film 31 is continuously formed on portions corresponding to the openings 14x of the second insulation film 14. The common electromechanical transducer film 31 includes openings 31y corresponding to the openings 14y of the second insulation film 14. The lower electrode terminal 12c is exposed in the openings 31y. Note that, though not represented in the cross section of FIG. 12, the upper electrode terminal 12e is exposed in the openings 31y corresponding to FIG. 2C in the common electromechanical transducer film 31. In addition, though not represented in the cross section of FIG. 12, the common electromechanical transducer film 31 includes openings corresponding to the openings 14z of the second insulation film 14. The wiring 12d is exposed in the openings.

The second conductive film 15 is formed on the common electromechanical transducer film 31. The second conductive film 15 includes the openings 15x to expose the common electromechanical transducer film 31 formed on each lower electrode 12a. The planar shape of the opening 15x is formed to be smaller than the planar shape of the lower electrode 12a. The electromechanical transducer films 16 projecting from the surface of the second conductive film 15 are formed on the common electromechanical transducer film 31 exposed in the openings 15x of the second conductive film 15.

FIGS. 13A through 13D are illustrations of a production process of the electromechanical transducer according to the third embodiment. In FIGS. 13A through 13D, a cross section corresponding to the cross section of FIG. 12 is illustrated. First, in the step illustrated in FIG. 13A, the first insulation film 11 and the first conductive film 12 are laminated in turn on the substrate 10. After the first conductive film 12 is patterned as illustrated in FIG. 3A, the ceramic film 13 is laminated on the entire upper surface. Then, the ceramic film 13 is patterned into a desired shape. Note that, though the pattern shape of the ceramic film 13 in FIGS. 13A through 13D differs from the pattern shape in the first embodiment, the difference does not substantially matter. For example, the ceramic film 13 may have a pattern shape similar to the pattern shape in the first embodiment. Note that the ceramic film 13 may be provided as needed.

Figure 13A:
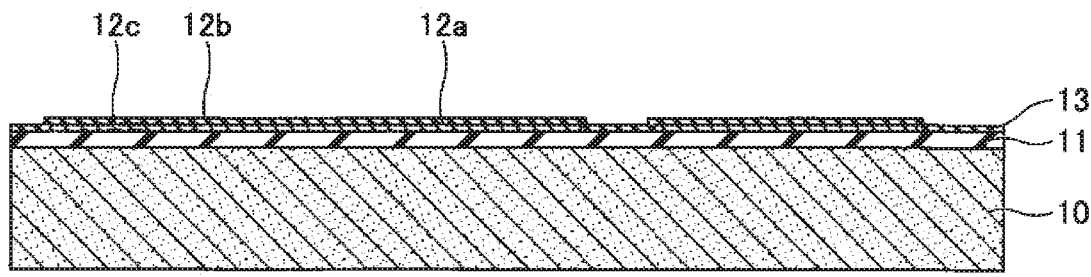
FIGS. 13A through 13D are illustrations of a production process of the electromechanical transducer according to the third embodiment.
Figure 13B:
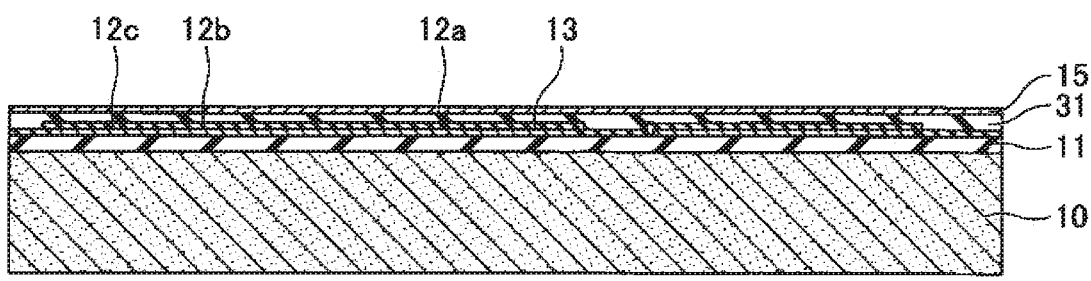

Next, in the step illustrated in FIG. 13B, the common electromechanical transducer film 31 as a cover film to serially cover the plurality of lower electrodes 12a is formed and the second conductive film 15 is formed on the common electromechanical transducer film 31. Similarly with the electromechanical transducer film 16, the precursor solution is spin-coated on the structural body illustrated in FIG. 13A and dried, thermally decomposed, and crystallized to form the common electromechanical transducer film 31. The common electromechanical transducer film 31 is formed at a thickness of, for example, 100 nm per layer. A similar process is repeated twenty times to from a thick layer of approximately 2 µm. The method of film formation of the second conductive film 15 is similar to, even if not the same as, the method in the first embodiment.

Figure 13C:
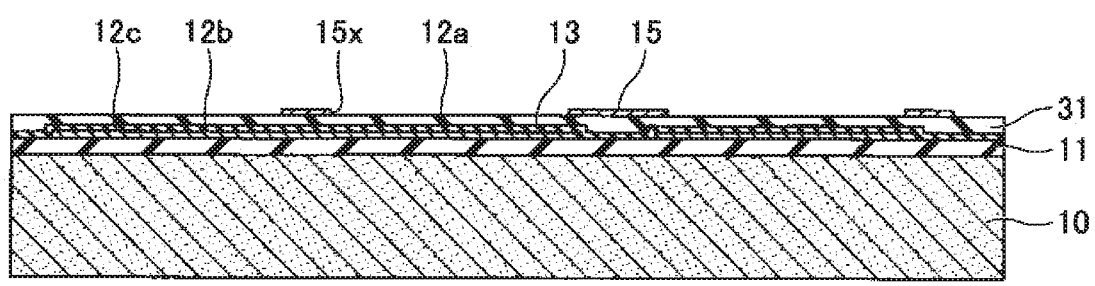

Next, in the step illustrated in FIG. 13C, similarly with the step of FIG. 6F in the first embodiment, the second conductive film 15 is patterned into a desired shape (the shape illustrated in FIG. 4B). However, the step corresponding to FIG. 6E in the first embodiment is not included, and the second conductive film 15 is patterned into a desired shape (the shape illustrated in FIG. 4B) in a single step. Similarly with the first embodiment, etching can be performed by a dry etcher using ICP as a plasma source. In this step, since only the second conductive film 15 is etched, a resist having a thickness of approximately 1 µm is used as a mask. Accordingly, processing can be performed at higher accuracy than in the first embodiment. In this step, the openings 15x to expose the common electromechanical transducer film 31 formed on the lower electrodes 12a are formed in the second conductive film 15. The planar shape of the opening 15x is formed to be smaller than the planar shape of the lower electrode 12a.

Figure 13D:
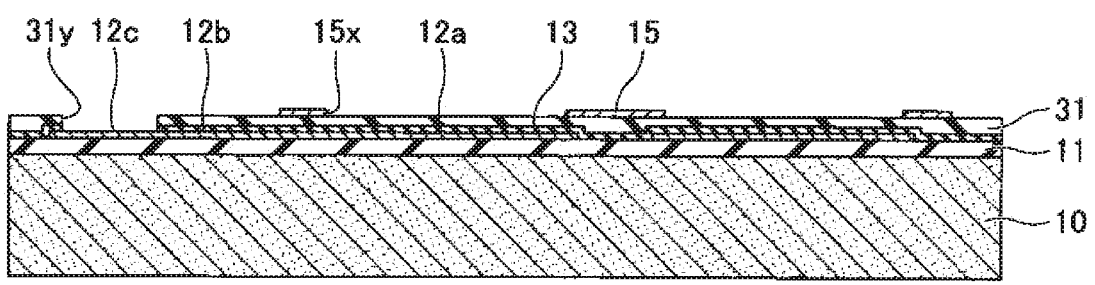

Next, in the step illustrated in FIG. 13D, the openings 31y corresponding to the openings 14y of the second insulation film 14 are formed in the common electromechanical transducer film 31 by photolithography and etching, to expose the lower electrode terminals 12c and the upper electrode terminals 12e in the openings 31y. Openings corresponding to the openings 14z of the second insulation film 14 are formed in the common electromechanical transducer film 31, to expose the wirings 12d in the openings. Each opening formed in the common electromechanical transducer film 31 is sufficient if electrical connection is secured. Since the pattern size of the opening is relatively large and high accuracy is not so required, the opening can be formed by, for example, wet etching using an etchant of fluonitric acid.

Next, in the step illustrated in FIG. 14A, the individual electromechanical transducer films 16 projecting from the surface of the second conductive film 15 are formed on the common electromechanical transducer film 31 exposed in the respective openings 15x. For example, first, similarly with the first embodiment, the repellent film 100 is formed on the second conductive film 15. Then, according to an inkjet method using a liquid discharge apparatus including the liquid discharge head 200, the precursor solution of the electromechanical transducer film 16 is selectively coated on the common electromechanical transducer films 31 exposed in the openings 15x to form the coating films.

Next, by heating the coating film, the coating film is dried, thermally-decomposed, and crystallized. At this time, the repellent film 100 is eliminated. By adjusting the application amount of the precursor solution, the crystallized film is adjusted to have a thickness of approximately 100 nm. The greater the film thickness formed one time, the greater the productivity. However, the greater the film thickness, the more the crack is likely to occur. In the present embodiment, the crystallized film is adjusted to have a thickness of approximately 100 nm.

In addition, the process of the formation of the repellent film 100 on the second conductive film 15, the selective coating of the precursor solution, the drying, thermal decomposition, and crystallization of the coating film by heating is repeated until a desired thickness of the electromechanical transducer film 16 is obtained. By repeating the above-described process, for example, approximately 80 times, the electromechanical transducer film 16 having a thickness of approximately 8 µm can be formed. Note that, when high accuracy is required for the thickness of the electromechanical transducer film 16, the thickness may be measured on the course of the formation of the electromechanical transducer film 16. Based on the measurement result, the number of additional lamination processes may be adjusted.

Next, in the step illustrated in FIG. 14B, the upper electrode 17 is formed to serially cover the electromechanical transducer films 16 projecting from the surface of the second conductive film 15. For example, similarly with the step illustrated in FIG. 8D in the first embodiment, using a solid mask 540, such as a metal mask, a film of the upper electrode 17 is formed only at openings of the solid mask 540 by, e.g., sputtering. The material and film thickness of the upper electrode 17 may be, for example, the material and thickness in the first embodiment. Note that the upper electrode 17 may be formed in a similar manner to the step illustrated in FIGS. 9A thorough 9C.

As described above, in the present embodiment, the accuracy of processing of the second conductive film 15 to define the plane dimension of the common electromechanical transducer film 31 can be higher than the accuracy in the first embodiment. Accordingly, the properties of the electromechanical transducer 3 can be further enhanced than the properties of the electromechanical transducer 1.

Fourth Embodiment

In the fourth embodiment, a description is given of an example of a liquid discharge head including an electromechanical transducer. Note that, in the fourth embodiment, redundant descriptions may be omitted below of the same configurations as the configurations of the above-described embodiments.

Figure 15:
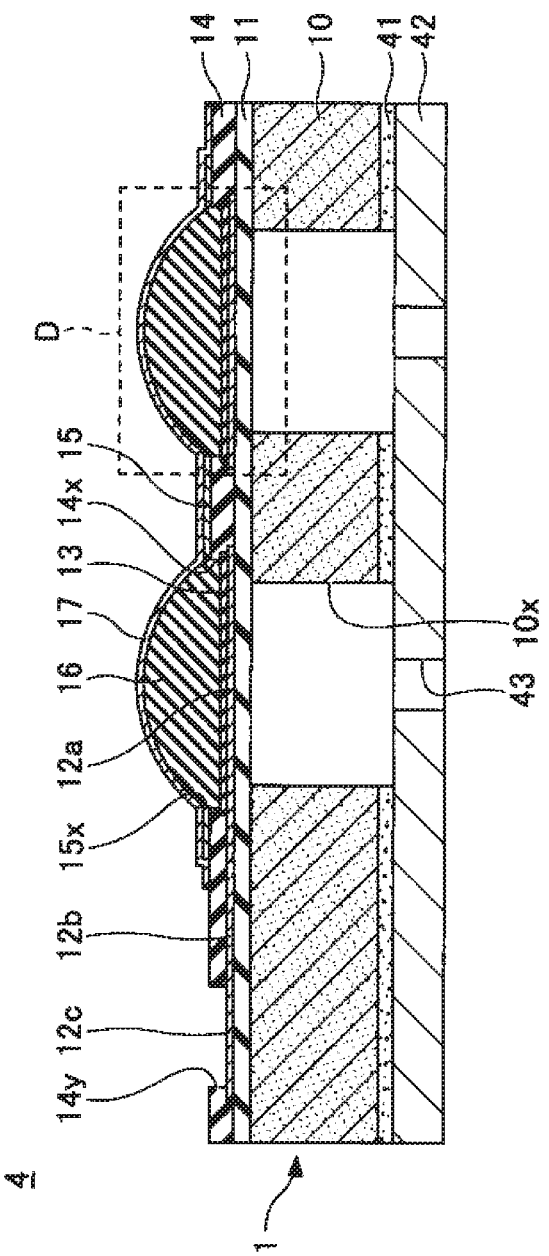
FIG. 15 is a cross-sectional view of the liquid discharge head according to a fourth embodiment of the present disclosure.

FIG. 15 is a cross-sectional view of the liquid discharge head according to the fourth embodiment. In FIG. 15, a cross section corresponding to the cross section cut along A-A in FIG. 1A is illustrated.

As seen from FIG. 15, the penetration portions 10x are used as liquid chambers in the liquid discharge head 4 according to the fourth embodiment. On an opposite side (a back side of the substrate 10) of an electromechanical-transducer-film side of the liquid chamber (penetration portion 10x) on which the electromechanical transducer film 16 is formed, a nozzle plate 42 is bonded via adhesive 41. In the nozzle plate 42, nozzles 43 are formed for respective chambers. The liquid discharge head 4 further includes, for example, a liquid supply channel, a frame substrate for maintenance, a driver integrated circuit (IC), and a flexible print cable (FPC) for connection.

As described above, the liquid discharge head 4 includes the chambers communicated with the nozzles 43, which are provided corresponding to the electromechanical transducer films 16. In the liquid discharge head 4, voltage is applied to between the lower electrode terminal 12c connected to each electromechanical transducer film 16 and the upper electrode terminal 12e being the common electrode to vibrate the electromechanical transducer film 16. Accordingly, the pressure to liquid in the liquid chamber is raised to discharge the liquid from the nozzle 43.

Using the electromechanical transducer 1 of high power, high accuracy, and low cost can achieve the liquid discharge head 4 of high discharge performance and high accuracy.

Fifth Embodiment

In the fifth embodiment, a description is given of an example of a liquid discharge apparatus 1000 including the liquid discharge head 4 (see FIG. 15).

Figure 16:
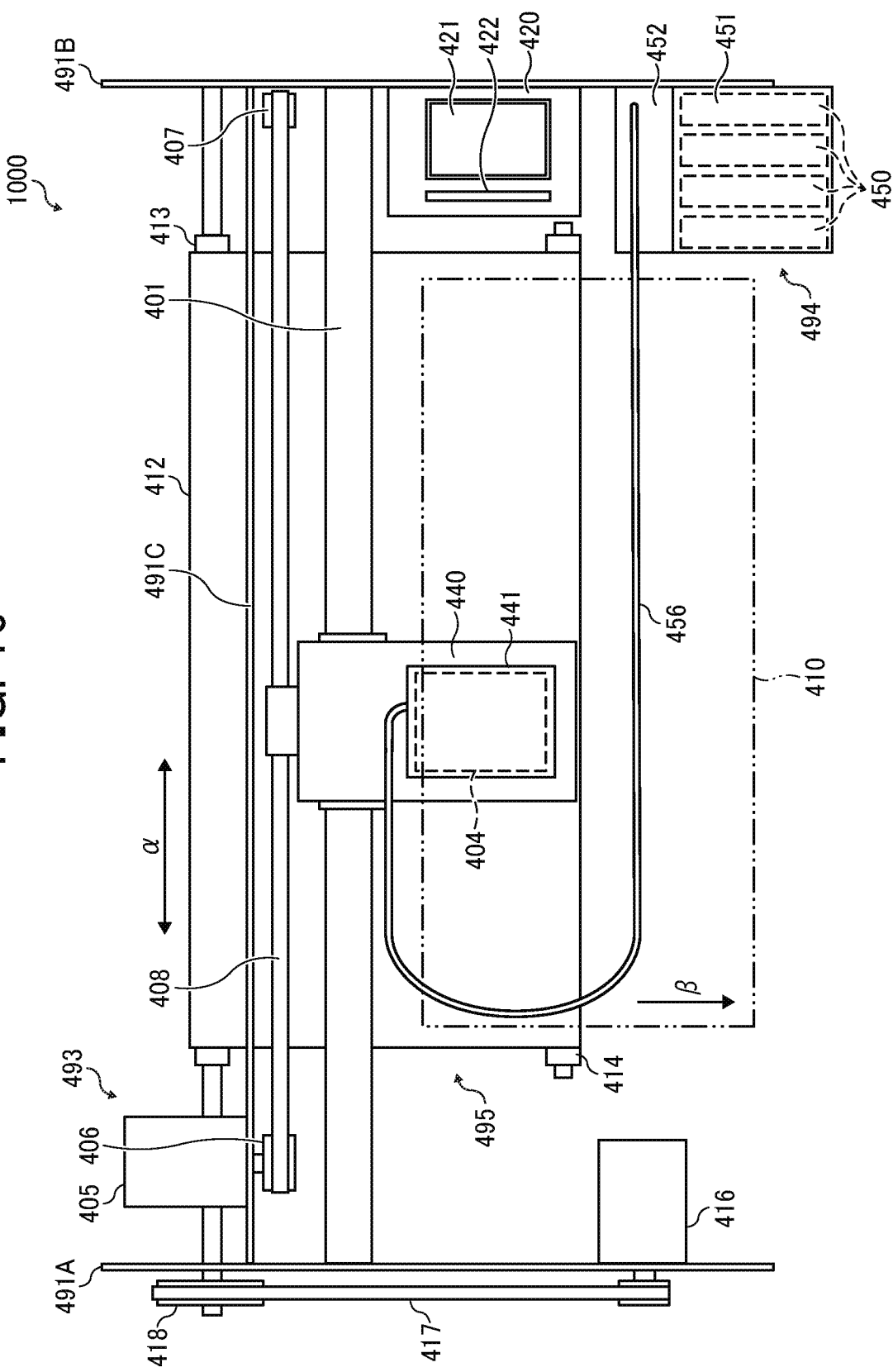
FIG. 16 is a plan view of an example of a liquid discharge apparatus including a liquid discharge device according to a fifth embodiment of the present disclosure.
Figure 17:
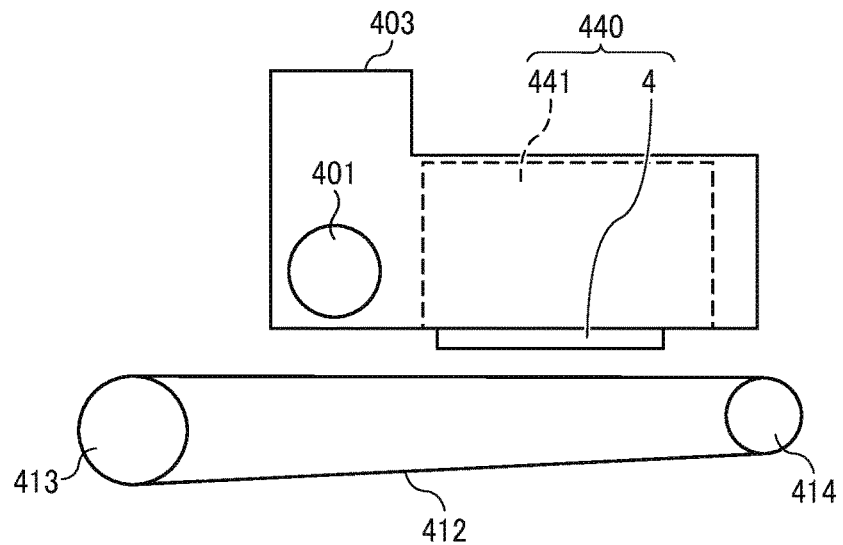
FIG. 17 is a side view of the liquid discharge apparatus according to the fifth embodiment.

First, an example of the liquid discharge apparatus according to the fifth embodiment is described with reference to FIGS. 16 and 17. FIG. 16 is a plan view of a portion of the liquid discharge apparatus according to an embodiment of the present disclosure. FIG. 17 is a side view of a portion of the liquid discharge apparatus of FIG. 16.

The liquid discharge apparatus 1000 according to the present embodiment is a serial-type apparatus in which a main scan moving unit 493 reciprocally moves a carriage 403 in the main scanning direction α in FIG. 16. The main scan moving unit 493 includes, e.g., a guide 401, a main scanning motor 405, and a timing belt 408. The guide 401 is laterally bridged between a left side plate 491A and a right side plate 491B and supports the carriage 403 so that the carriage 403 is movable along the guide 401. The main scanning motor 405 reciprocally moves the carriage 403 in the main scanning direction α via the timing belt 408 laterally bridged between a drive pulley 406 and a driven pulley 407.

The carriage 403 mounts a liquid discharge device 440 in which the liquid discharge head 4 according to the fourth embodiment and a head tank 441 are integrated as a single unit. The liquid discharge head 4 of the liquid discharge device 440 discharges ink droplets of respective colors of yellow (Y), cyan (C), magenta (M), and black (K). The liquid discharge head 4 has at least one nozzle row, each including a plurality of nozzles 43 arrayed in row (nozzle row) in a sub-scanning direction indicated by arrow β, which is perpendicular to the main scanning direction α. The liquid discharge head 4 is mounted on the carriage 403 so that the liquid discharge head 4 discharge liquid downwardly from the nozzles 43.

The liquid stored outside the liquid discharge head 4 is supplied to the liquid discharge head 4 via a supply unit 494 that supplies the liquid from a liquid cartridge 450 to the head tank 441.

The supply unit 494 includes, e.g., a cartridge holder 451 as a mount part to mount a liquid cartridge 450, a tube 456, and a liquid feed unit 452 including a liquid feed pump. The liquid cartridge 450 is detachably attached to the cartridge holder 451. The liquid is supplied to the head tank 441 by the liquid feed unit 452 via the tube 456 from the liquid cartridge 450.

The liquid discharge apparatus 1000 includes a conveyance unit 495 to convey a sheet 410. The conveyance unit 495 includes a conveyance belt 412 as a conveyor and a sub-scanning motor 416 to drive the conveyance belt 412.

The conveyance belt 412 electrostatically attracts the sheet 410 and conveys the sheet 410 at a position facing the liquid discharge head 404. The conveyance belt 412 is an endless belt and is stretched between a conveyance roller 413 and a tension roller 414. The sheet 410 is attracted to the conveyance belt 412 by electrostatic force or air aspiration.

The conveyance roller 413 is driven and rotated by the sub-scanning motor 416 via a timing belt 417 and a timing pulley 418, so that the conveyance belt 412 circulates in the sub-scanning direction β.

At one end in the main scanning direction α of the carriage 403, a maintenance unit 420 is disposed at a lateral side of the conveyance belt 412 to maintain and recover the liquid discharge head 4.

The maintenance unit 420 includes, for example, a cap 421 to cap a nozzle face (i.e., a face on which the nozzles 43 are formed) of the liquid discharge head 4 and a wiper 422 to wipe the nozzle face.

The main scan moving unit 493, the supply unit 494, the maintenance unit 420, and the conveyance unit 495 are mounted to a housing that includes the left side plate 491A, the right side plate 491B, and a rear side plate 491C.

In the liquid discharge apparatus 1000 thus configured, a sheet 410 is conveyed on and attracted to the conveyance belt 412 and is conveyed in the sub-scanning direction β by the cyclic rotation of the conveyance belt 412.

The liquid discharge head 4 is driven in response to image signals while the carriage 403 moves in the main scanning direction α, to discharge liquid to the sheet 410 stopped, thus forming an image on the sheet 410.

As described above, the liquid discharge apparatus 1000 includes the liquid discharge head 404 according to the fourth embodiment, thus allowing stable formation of high quality images.

Figure 18:
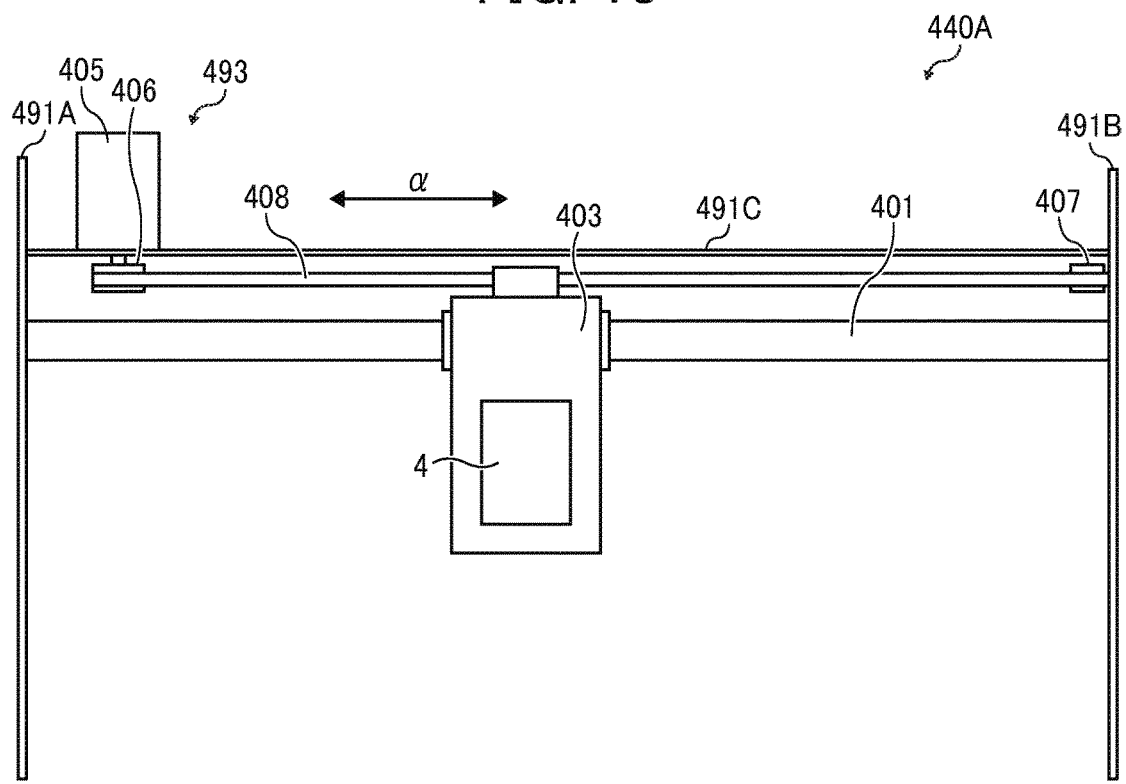
FIG. 18 is a plan view of a portion of another example of the liquid discharge device according to the fifth embodiment.

Next, another example of the liquid discharge device according to the fifth embodiment is described with reference to FIG. 18. FIG. 18 is a plan view of a portion of another example of the liquid discharge device (liquid discharge device 440A).

The liquid discharge device 440A includes the housing, the main scan moving unit 493, the carriage 403, and the liquid discharge head 4 among components of the liquid discharge apparatus 1000. The left side plate 491A, the right side plate 491B, and the rear side plate 491C constitute the housing.

Note that, in the liquid discharge device 440A, at least one of the maintenance unit 420 and the supply unit 494 may be mounted on, for example, the right side plate 491B.

Figure 19:
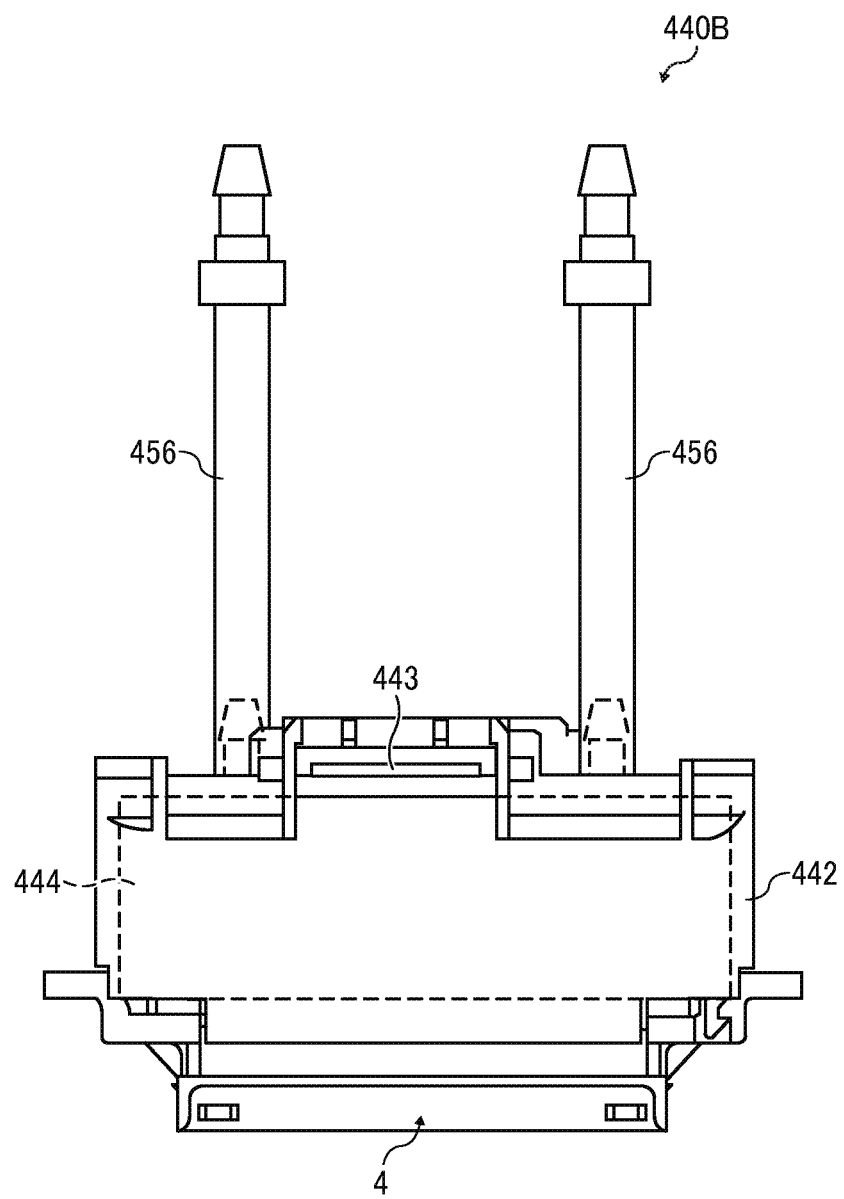
FIG. 19 is a front view of still another example of the liquid discharge device according to the fifth embodiment.

Next, still another example of the liquid discharge device according to the fifth embodiment is described with reference to FIG. 19. FIG. 19 is a front view of still another example of the liquid discharge device (liquid discharge device 440B).

The liquid discharge device 440B includes the liquid discharge head 4 to which a channel part 444 is mounted, and the tube 456 connected to the channel part 444.

Further, the channel part 444 is disposed inside a cover 442. Instead of the channel part 444, the liquid discharge device 440B may include the head tank 441. A connector 443 to electrically connect the liquid discharge head 4 to a power source is disposed above the channel part 444.

In the above-described embodiments of the present disclosure, the liquid discharge apparatus includes the liquid discharge head or the liquid discharge device, and drives the liquid discharge head to discharge liquid. The liquid discharge apparatus may be, for example, an apparatus capable of discharging liquid to a material to which liquid can adhere and an apparatus to discharge liquid toward gas or into liquid.

The liquid discharge apparatus may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged.

The liquid discharge apparatus may be, for example, an image forming apparatus to form an image on a sheet by discharging ink, or a solid fabrication apparatus (three-dimensional fabricating apparatus) to discharge a fabrication liquid to a powder layer in which powder material is formed in layers, so as to form a solid fabrication object (three-dimensional fabrication object).

The liquid discharge apparatus is not limited to an apparatus to discharge liquid to visualize meaningful images, such as letters or figures. For example, the liquid discharge apparatus may be an apparatus to form meaningless images, such as meaningless patterns, or fabricate three-dimensional images. The above-described term "material on which liquid can be adhered" represents a material on which liquid is at least temporarily adhered, a material on which liquid is adhered and fixed, or a material into which liquid is adhered to permeate. Examples of the "material on which liquid can be adhered" include recording media, such as paper sheet, recording paper, recording sheet of paper, film, and cloth, electronic component, such as electronic substrate and piezoelectric element, and media, such as powder layer, organ model, and testing cell. The "material on which liquid can be adhered" includes any material on which liquid is adhered, unless particularly limited.

Examples of the material on which liquid can be adhered include any materials on which liquid can be adhered even temporarily, such as paper, thread, fiber, fabric, leather, metal, plastic, glass, wood, and ceramic.

Examples of the liquid are, e.g., ink, treatment liquid, DNA sample, resist, pattern material, binder, fabrication liquid, or solution and dispersion liquid including amino acid, protein, or calcium.

The liquid discharge apparatus may be an apparatus to relatively move a liquid discharge head and a material on which liquid can be adhered. However, the liquid discharge apparatus is not limited to such an apparatus. For example, the liquid discharge apparatus may be a serial head apparatus that moves the liquid discharge head or a line head apparatus that does not move the liquid discharge head.

Examples of the liquid discharge apparatus further include a treatment liquid coating apparatus to discharge a treatment liquid to a sheet to coat the treatment liquid on the surface of the sheet to reform the sheet surface and an injection granulation apparatus in which a composition liquid including raw materials dispersed in a solution is injected through nozzles to granulate fine particles of the raw materials.

The liquid discharge device is an integrated unit including the liquid discharge head and a functional part(s) or unit(s), and is an assembly of parts relating to liquid discharge. For example, the liquid discharge device may be a combination of the liquid discharge head with at least one of the head tank, the carriage, the supply unit, the maintenance unit, and the main scan moving unit.

Here, examples of the integrated unit include a combination in which the liquid discharge head and a functional part(s) are secured to each other through, e.g., fastening, bonding, or engaging, and a combination in which one of the liquid discharge head and a functional part(s) is movably held by another. The liquid discharge head may be detachably attached to the functional part(s) or unit(s) s each other.

The liquid discharge device may be, for example, a liquid discharge device in which the liquid discharge head and the head tank are integrated as a single unit, such as the liquid discharge device 440 illustrated in FIG. 17. The liquid discharge head and the head tank may be connected each other via, e.g., a tube to integrally form the liquid discharge device. Here, a unit including a filter may further be added to a portion between the head tank and the liquid discharge head.

In another example, the liquid discharge device may be an integrated unit in which a liquid discharge head is integrated with a carriage.

In still another example, the liquid discharge device may be the liquid discharge head movably held by a guide that forms part of a main-scanning moving device, so that the liquid discharge head and the main-scanning moving device are integrated as a single unit. Like the liquid discharge device 440A illustrated in FIG. 18, the liquid discharge device may be an integrated unit in which the liquid discharge head, the carriage, and the main scan moving unit are integrally formed as a single unit.

In another example, the cap that forms part of the maintenance unit is secured to the carriage mounting the liquid discharge head so that the liquid discharge head, the carriage, and the maintenance unit are integrated as a single unit to form the liquid discharge device.

Like the liquid discharge device 440B illustrated in FIG. 19, the liquid discharge device may be an integrated unit in which the tube is connected to the liquid discharge head mounting the head tank or the channel part so that the liquid discharge head and the supply unit are integrally formed.

The main scan moving unit may be a guide only. The supply unit may be a tube(s) only or a loading unit only.

The pressure generator used in the liquid discharge head is not limited to a particular-type of pressure generator. The pressure generator is not limited to the piezoelectric actuator (or a layered-type piezoelectric element) described in the above-described embodiments, and may be, for example, a thermal actuator that employs a thermoelectric conversion element, such as a thermal resistor or an electrostatic actuator including a diaphragm plate and opposed electrodes.

The terms "image formation", "recording", "printing", "image printing", and "fabricating" used herein may be used synonymously with each other.

Illustrative embodiments of the present disclosure have been described above. However, embodiments of the present disclosure are not limited to the above-described embodiments and various modifications are possible within the scope of claims unless explicitly limited in the description.

For example, the liquid discharge head including the electromechanical transducer according to an embodiment of the present disclosure is also applicable to, for example, a micro pump, a supersonic motor, an acceleration sensor, a biaxial scanner for projector, or a liquid feed pump.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A method of producing an electromechanical transducer that includes a plurality of electromechanical transducer elements on a substrate, the method comprising:
   forming a plurality of individual electrodes corresponding to the plurality of electromechanical transducer elements on the substrate;
   forming an insulation film to cover the plurality of individual electrodes on the substrate;
   forming a conductive film on the insulation film;
   forming a plurality of openings to expose the plurality of individual electrodes in each of the insulation film and the conductive film; and
   forming a plurality of electromechanical transducer films on the plurality of individual electrodes exposed in the plurality of openings, respectively, each of the plurality of electromechanical transducer films filling each of the respective plurality of openings, and the plurality of electromechanical transducer films protruding from a surface of the conductive film.

2. The method according to claim 1, further comprising forming a common electrode to serially cover the plurality of electromechanical transducer films exposed in the plurality of openings.

3. The method according to claim 1, wherein the conductive film includes a platinum group element, Ag, or Au, or an alloy of at least two of the platinum group element, Ag, and Au.

4. The method according to claim 1, further comprising forming a ceramic film on the plurality of individual electrodes,
   wherein the ceramic film includes lead titanate or lead zirconate titanate rich in lead titanate.

5. A method of producing an electromechanical transducer that includes a plurality of electromechanical transducer elements on a substrate, the method comprising:
   forming a plurality of individual electrodes corresponding to the plurality of electromechanical transducer elements on the substrate;
   forming an insulation film to cover the plurality of individual electrodes on the substrate;
   forming a conductive film on the insulation film;
   forming a plurality of openings to expose the plurality of individual electrodes in each of the insulation film and the conductive film;
   forming a plurality of electromechanical transducer films on the plurality of individual electrodes exposed in the plurality of openings; and
   treating a surface of the conductive film to be more hydrophobic than a plurality of exposed portions in the plurality of openings,
   wherein the step of forming the plurality of electromechanical transducer films comprises applying liquid to the plurality of exposed portions in the plurality of openings according to an inkjet method to form a plurality of coating films, and heating the plurality of coating films, the applying and heating steps being repeated to form the plurality of electromechanical transducer films in which the plurality of coating films are crystallized.

6. The method according to claim 5, wherein the treating of the surface of the conductive film includes performing surface treatment with a solution of a thiol compound and forming a self-organized film of the thiol compound.

7. The method according to claim 5, wherein the conductive film includes a platinum group element, Ag, or Au, or an alloy of at least two of the platinum group element, Ag, and Au.

8. The method according to claim 5, further comprising forming a ceramic film on the plurality of individual electrodes, wherein the ceramic film includes lead titanate or lead zirconate titanate rich in lead titanate.

9. A method of producing a sensor including an electromechanical transducer that includes a plurality of electromechanical transducer elements on a substrate, the method comprising:
   forming a plurality of individual electrodes corresponding to the plurality of electromechanical transducer elements on the substrate;
   forming an insulation film to cover the plurality of individual electrodes on the substrate;
   forming a conductive film on the insulation film;
   forming a plurality of openings to expose the plurality of individual electrodes in each of the insulation film and the conductive film; and
   forming a plurality of electromechanical transducer films on the plurality of individual electrodes exposed in the plurality of openings, respectively, each of the plurality of electromechanical transducer films filling each of the respective plurality of openings, and the plurality of electromechanical transducer films protruding from a surface of the conductive film.

* * * * *